United States Patent
Michaelis et al.

(10) Patent No.: US 6,285,310 B1
(45) Date of Patent: Sep. 4, 2001

(54) INTEGRATING ANALOG/DIGITAL CONVERTER

(75) Inventors: Rolf Michaelis, Lenglern; Alfred Klauer, Goettingen; Thomas Schink, Goettingen; Christoph Berg, Goettingen, all of (DE)

(73) Assignee: Sartorius Aktiengesellschaft, Goettingen (DE)

( * ) Notice: Subject to any disclaimer, the term of this patent is extended or adjusted under 35 U.S.C. 154(b) by 0 days.

(21) Appl. No.: 09/759,340

(22) Filed: Jan. 16, 2001

(51) Int. Cl.$^7$ ...................................................... H03M 1/50
(52) U.S. Cl. .......................... 341/166; 341/167; 341/157; 341/155; 341/168; 341/169; 341/170; 341/128; 341/129; 341/118
(58) Field of Search .................................... 341/166, 167, 341/157, 118, 155, 168, 169, 170, 128, 129

(56) References Cited

U.S. PATENT DOCUMENTS

| | | |
|---|---|---|
| 3,765,012 | 10/1973 | Grutzediek et al. . |
| 4,361,831 | 11/1982 | Grutzediek et al. . |
| 4,598,270 * | 7/1986 | Shutt et al. ............................ 340/347 |
| 4,994,807 * | 2/1991 | Hobbs .................................... 341/157 |
| 5,066,955 | 11/1991 | Scheerer et al. . |
| 5,117,227 * | 5/1992 | Goeke .................................... 341/166 |
| 5,262,780 | 11/1993 | Gray . |

* cited by examiner

Primary Examiner—Michael Tokar
Assistant Examiner—Lam T. Mai
(74) Attorney, Agent, or Firm—Sughrue, Mion, Zinn, Macpeak & Seas, PLLC

(57) ABSTRACT

An analog/digital converter including an amplifier (1) wired as an integrator, a comparator (2) electrically downstream from the integrator, a time counter (6) which continually counts the pulses of a pulse generator (5), a bistable element (4), and additional circuitry. The bistable element (4) drives the input network of the amplifier (1) with at least one switch (3) in such a way that in one of its two positions ("off" condition) a current $I_x$ proportional to the analog measured value is integrated, and in the other position ("on" condition) a constant reference current $I_{ref}$ with opposite polarity to the current $I_x$ is integrated in addition to current $I_x$. The switching of the bistable element from the "off" condition to the "on" condition is controlled by the time counter, and the switching from the "on" condition to the "off" condition (switch-off time) is controlled by the output signal of the comparator, which is generally synchronized with the pulses of the pulse generator. The pulses of the pulse generator (5) are summed to a result during the time the bistable element is in its "on" position. The additional circuitry displaces the switch-off time of the bistable element (4) beyond the time resulting from the above synchronization by a number of pulses of the pulse generator (5) determined by an arithmetic unit (31).

46 Claims, 16 Drawing Sheets

INTEGRATING ANALOG/DIGITAL CONVERTER

FIELD OF THE INVENTION

The invention relates to an integrating analog/digital converter. In general, such analog/digital converters include: an amplifier wired as an integrator, a comparator provided downstream from the integrator, a time counter which continually counts the pulses of a pulse generator, and a bistable element. The bistable element drives the input network of the amplifier with at least one switch in such a way that in one of its two positions ("off" condition) a current $I_x$ proportional to the analog measured value is integrated, and in the other position ("on" condition) a constant reference current $I_{ref}$ with opposite polarity to $I_x$ is added to $I_x$ and both are integrated. The switching of the bistable element from the "off" condition to the "on" condition is controlled by the time counter; and the switching from the "on" condition to the "off" condition (switch-off time) is controlled by the output signal of the comparator, which is generally synchronized with the pulses of the pulse generator. The pulses of the pulse generator are summed to a result during the time the bistable element is in its "on" position.

BACKGROUND OF THE INVENTION

Analog/digital converters of this type are known from U.S. Pat. Nos. 3,765,012, 4,361,831, and 5,262,780.

A circuit diagram of this so-called multiple ramp procedure is depicted in FIG. 1. In addition, FIG. 2 depicts the time trace of the voltage $V_C$ at the integration capacitor C and/or at the output 11 of the integrator 1, for explaining the method of operation.

The current $I_x$ to be measured is continuously supplied to the input 10 of the integrator 1. If the analog/digital converter is used as a voltage meter, the measurement voltage is converted via a fixed resistor into a measurement current $I_x$. At certain times, the switch 3 is closed and the input 10 of the integrator 1 is additionally supplied with a fixed reference current $I_{ref}$ of polarity opposite that of $I_x$. The reference current $I_{ref}$ can, for example, be produced from a Zener diode (=reference voltage) and a fixed resistor. For illustrating the temporal sequence in FIG. 2, it is assumed that $I_x$ is negative and $I_{ref}$ is positive. Starting from a voltage level zero at the integration capacitor C at time $t_1$ in FIG. 2, the switch 3 is open during the period $T_1$, and the voltage $V_C$ at the output 11 of the integrator 1 increases proportionally to $I_x$. After the time $T_1$, this voltage reaches the value:

$$V_0 = -\frac{I_x}{C} \cdot T_1 \quad (1)$$

At time $t_2$ in FIG. 2, the switch 3 is closed. Since $I_{ref} > -I_x$, the influence of $I_{ref}$ now predominates, and the voltage $V_C$ falls until it reaches the value zero again at time $t_3$. The following equation then applies for the charge balance:

$$-\frac{I_x}{C} \cdot T_1 = V_0 = \frac{I_x + I_{ref}}{C} \cdot T_2 \quad (2)$$

After appropriate transformation, one obtains:

$$\frac{I_x}{I_{ref}} = -\frac{T_2}{T_1 + T_2} = -\frac{T_2}{T} \quad (3)$$

If $T_1+T_2=T=$constant and $I_{ref}=$constant, then $T_2$ is directly proportional to the current $I_x$ to be measured.

In the circuit of FIG. 1, the switch 3 is driven by a bistable element 4 which closes the switch 3 in its "on" condition and opens the switch 3 in its "off" condition. The switching to the "on" position at the times $t_0$, $t_2$, $t_4$ etc. in FIG. 2 results from the overflow signal of a time counter 6 on the line 12. The time counter 6 continuously counts the pulses of a pulse generator 5, so that the overflow signal appears at regular time intervals. This allows the condition $T_1+T_2=T=$constant to be realized. The switching of the bistable element 4 back into the "off" condition at the times $t_1$, $t_3$ etc. in FIG. 2 results from the output signal of the comparator 2 (line 13) upon reaching the zero line of the integrator voltage at point 11 in FIG. 1. If the switch 3 is closed, a gate 8 is opened via a line 14, so that, during the time $T_2$, the pulses of the pulse generator 5 are registered in a result counter 7. This pulse count proportional to $T_2$ is thereby, according to equation (3), also proportional to the current $I_x$ to be measured, since T and $I_{ref}$ are constant. The microprocessor 9 in FIG. 1 also receives the comparator signal via line 15. Following the next pulse of the pulse generator (which is simultaneously the clock unit for the microprocessor 9 in FIG. 1), the microprocessor can read out the value of the result counter 7 and output and/or further process this value as the measurement result of a single measurement cycle. The result counter 7 is reset to zero via the line 16 at the times $t_0$, $t_2$, $t_4$ etc.

In the circuit of FIG. 1, it is further provided that the opening of the switch 3 does not occur in synchronization with the comparator signal on the line 13, but only with the next pulse of the pulse generator 5 (synchronization input 60 on the bistable element 4). The equation (2) thereby is only approximate for each measurement cycle. However, the small deviations are transferred in analog form to the next measurement cycle, so that this error cancels out over several measurement cycles. Switching in synchronization with the pulse of the pulse generator 5 has the great advantage that $T_1$ as well as $T_2$ are always exact multiples of the clock period of the pulse generator 5, so that no rounding errors can add up during the adding/averaging of several measurement cycles. A total result with N-fold resolution results from the sum—or the running sum—and/or the average of N measurement cycles. The practical resolution is limited only by the quality of the components used.

The multiple ramp process is described only briefly in the preceding passages. Particulars can be found in the patent specifications already cited.

Advantages of this process include:

The current $I_x$ is not switched; therefore there is no influence from current/voltage-dependent switching capacities of the switch;

The size of the integration capacitor C does not enter into the calculated result, as evident from equation (3);

Through averaging and/or summation over N measurement cycles, the resolution of the analog/digital converter can be increased in correlation to the number N;

The measurement results are available in a fixed time slot pattern, so that further averaging, calculation of rates of change, etc., are made easier.

This known process has the disadvantage, however, that after a change in current $I_x$ at the input, the pulses summed in the result counter only gradually converge to the correct final value and do not converge at all for values of $|I_x/I_{ref}|>1/2$.

This is to be explained in greater detail with reference to FIG. 3. Several sequential up-integrations and down-integrations are depicted here, just as in FIG. 2. The theoretical voltage trace at the capacitor C (in FIG. 1) in steady state condition is indicated with a dashed line; the actual voltage trace which occurs, for example, after a disturbance or after a sudden voltage change at the input (in which case the down-integration at time $t_0$ starts with a value which deviates from the steady state condition by a value $x_0$) is indicated with a solid line. The time error that thereby arises in the first down-integration is $s_1$, the time error arising in the second down-integration is $s_2$, etc.

Due to the parallel relationship of the two straight lines 17 and 18, one obtains, from the intercept theorems:

$$\frac{s_1}{T_1} = \frac{x_1}{V_0} \quad (4)$$

And, analogously, due to the parallel relationship of the two straight lines 19 and 20:

$$\frac{|s_2|}{T_2} = \frac{x_1}{V_0} \quad (5)$$

By elimination of $V_0$, one thus obtains:

$$|s_2| = \frac{T_2}{T_1} \cdot s_1 \quad (6)$$

If one considers that $s_2$ and $s_1$ have different signs and one generalizes equation (6) to the error $s_n$, one obtains:

$$s_n = -\frac{T_2}{T_1} \cdot s_{n-1} \quad (7)$$

One recognizes from this that, after a disturbance, the time error $s_n$ decays exponentially as long as $T_2<T_1$.

The time ratio $T_2/(T_1+T_2)$ in the equation (3) must therefore be smaller than 0.5 in order for the disturbance to die out. For $T_2>T_1$ and/or $T_2/(T_1+T_2)>0.5$, the time error $s_n$ increases with each measurement cycle, and the procedure thus diverges.

The time $T_2$, during which the bistable element 4 in FIG. 1 is in its "on" condition and in which the result counter 7 adds up the pulses of the pulse generator 5, must therefore remain restricted to values clearly under $0.5 \cdot (T_1+T_2)$. This restricted counting time for the result counter 7—restricted to under 50% of the total time—requires a pulse generator that is twice as fast in order to attain a predetermined resolution within a predetermined amount of time. Even if a single measurement period is made only approximately 10 ms long, the gradual convergence leads to a relatively long time to determine the measurement result, particularly when compared with the standard dual slope process, in which the final measurement result is available after only one up-integration and one down-integration.

It has already been attempted (U.S. Pat. No. 5,066,955) to improve the transient behavior of the system and to utilize the entire measurement time as counting time as well. This attempt has involved supplying quantities of charge periodically to the input of the integrator via capacitors. As the result of the capacitive coupling, the DC voltage component of these additional quantities of charge is, on average, zero, so that they have no influence on the measured value. However, the circuitry expenditure is significant and, in addition, non-ideal behavior of the additional capacitors leads to measurement errors.

In U.S. Pat. No. 5,262,780, the multiple ramp process is modified in that the total measurement time, which (in the context of that invention) extends from a first zero-crossing of the comparator over the duration of N measurement cycles to a further zero crossing of the comparator, is adjusted to the cycle duration of a dominant interfering frequency—generally the power-line frequency. This adjustment is accomplished, in particular, by displacement of the switch-on time of the bistable element in the last measurement cycle. The thereby resulting disturbance of the steady state trace of the integrator voltage must be corrected again at the beginning of the next complete measurement period. This procedure has the disadvantage that only measurements with very low conversion frequencies can be performed. In the case of interfering frequencies that are not captured by the cycle duration of the complete measurement period, this leads to aliasing errors for interfering frequencies greater than $1/(2 \cdot N \cdot T)$. In the case of changes in the current $I_x$ to be converted, the time for up to N measurement cycles can, in unfavorable situations, be lost before correct measurement begins.

A further disadvantage of the prior art cited is the high demands which the capacitor C of the integrator 1 has to satisfy. For different input currents $I_x$ at the analog/digital converter, different average DC voltage components occur at the integration capacitor C, because the switching points $t_1$, $t_3$ etc., in FIG. 2 are fixed at zero volts and the voltage at the other switching points at $t_0$, $t_2$, $t_4$ etc., changes depending on the value of $I_x$. This leads to hysteresis effects in many capacitor dielectrics and to a change in the capacitance, and thereby to hysteresis and linearity errors, in the analog/digital converter.

OBJECTS OF THE INVENTION

Accordingly, the objects of the invention include preventing the above-mentioned disadvantages. Thus, it is one specific object to have the oscillation of the analog/digital converter converge more rapidly to the final value. Another object is to achieve a convergence even when the "on" time of the bistable element is more than 50% of the total time. It is yet another object of the invention to prevent a change of the DC voltage component at the integration capacitor.

SUMMARY OF THE INVENTION

These and other objects are achieved in a first aspect of the invention by providing additional switching circuitry which, in addition to synchronizing the switch-off time with the pulses of the pulse generator, displaces the switch-off time of the bistable element by a number of pulses of the pulse generator determined by an arithmetic unit.

The ability to displace the switch-off time makes it possible to set the switch-off time so that, after a change of $I_x$, the new steady state final condition is reached immediately after the switch-off. Thus, with reference to FIG. 3, the original switch-off time 21', at which the solid straight line 19 reaches the zero value, can be displaced so far that the extension of the solid straight line 19 intersects the backward extension of the dashed straight line 22. It is thereby possible to delay the switch-off time, which would, according to the prior art, immediately trigger the switching of the bistable element 4. According to the invention, the switch 3 remains closed until this delayed time. As a result, the up-integration takes place immediately on the dashed curve of the steady state condition.

By controlling the switch-off time according to the invention, even with a large modulation of the analog/digital converter with $T_2/(T_1+T_2)>0.5$, in which the conventional process—as shown above—actually diverges, stability can be attained by continually setting the timing to a point on the steady state curve. In addition, through advantageous selection of the switch-off time, the steady state curve can be displaced so that the average value of the voltage at the capacitor C is constant, independent of the input signal—e.g., zero volts. The linearity properties of the converter improve as a result, because those properties of the capacitor dependent on the DC voltage cannot have any effect, in accordance with this process.

According to a second aspect of the invention, the objects are achieved in that the arithmetic unit estimates the steady state voltage trace at the integrator in each measurement cycle. From this, the arithmetic unit calculates and controls the displacement, for each switching time of the bistable element from the "off" condition to the "on" condition (switch-on time), in such a way that: in the case of change in $I_x$, the converter is stabilized immediately; and, in the case of a constant $I_x$, the steady state voltage trace is reached immediately, even if the bistable element is in the "on" condition more than 50% of the total time.

Following a change in $I_x$, it is possible to reach the new steady state final condition immediately after the switch-on time of the bistable element 4 by means of this displacement of the switch-on time during each measurement cycle as well=13 in contrast to the single displacement in the last of N individual measurements according to U.S. Pat. No. 5,262,780. With reference to FIG. 3, the switch-on time $t_2$ of the bistable element 4 can be displaced far enough to the right that the solid straight line 17, which represents the actual trace of the voltage, runs beyond the point 21 until it reaches the dashed line 20. According to this aspect of the invention, the switch 3 is not closed until this delayed time. As a result, the down-integration takes place immediately on the dashed curve of the steady state condition.

Even with a large modulation of the analog/digital converter with $T_2/(T_1+T_2)>0.5$, in which the prior art process actually diverges, stability can be attained by continually setting the timing to a point on the steady state curve.

In a third aspect of the invention, both of the above-described aspects are used in conjunction.

By displacing the switch-on and/or switch-off time of the bistable element, by a displacement amount determined in the arithmetic unit, for each possible measurement cycle, the desired improvements can be attained individually or in combination. By continually relaying the results of each measurement cycle, corrected by an amount equaling the displacement, to a running summation over N values, the conversion result can be obtained with N-fold resolution after N+1 measurement cycles. Moreover, in contrast to U.S. Pat. No. 5,262,780, the conversion result can be further processed up to the frequency $1/(2 \cdot T)$ without aliasing.

Certain advantageous refinements of the invention are defined in the dependent claims.

BRIEF DESCRIPTION OF THE DRAWINGS

The invention and certain advantageous refinements thereof are described in more detail with reference to the following figures:

FIG. 8b shows a timing diagram as a variant to FIG. 8a,

DETAILED DESCRIPTION OF THE PREFERRED EMBODIMENTS

Figure 1:
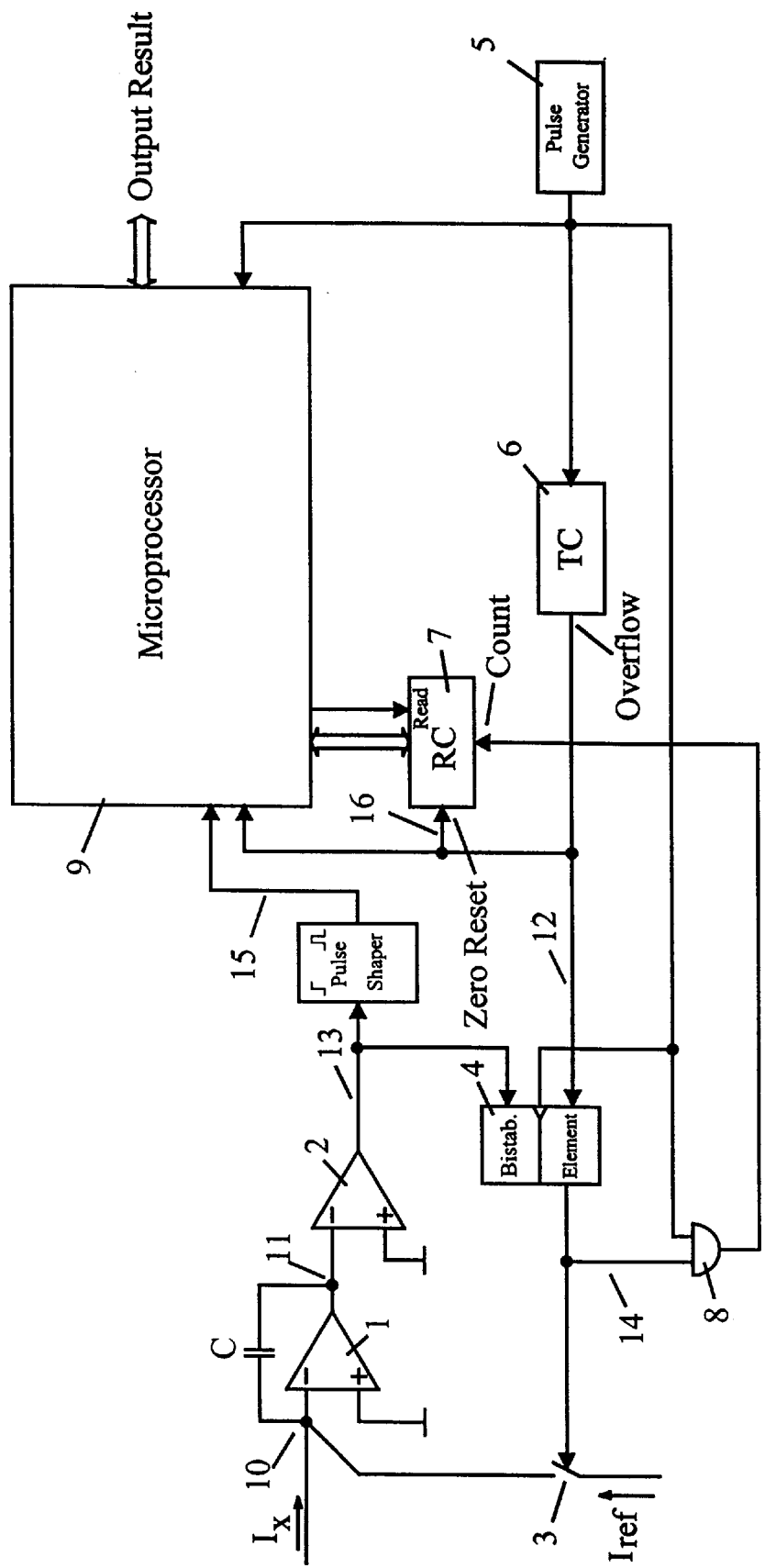
FIG. 1 shows a block circuit diagram of an analog/digital converter according to the related art.
Figure 4:
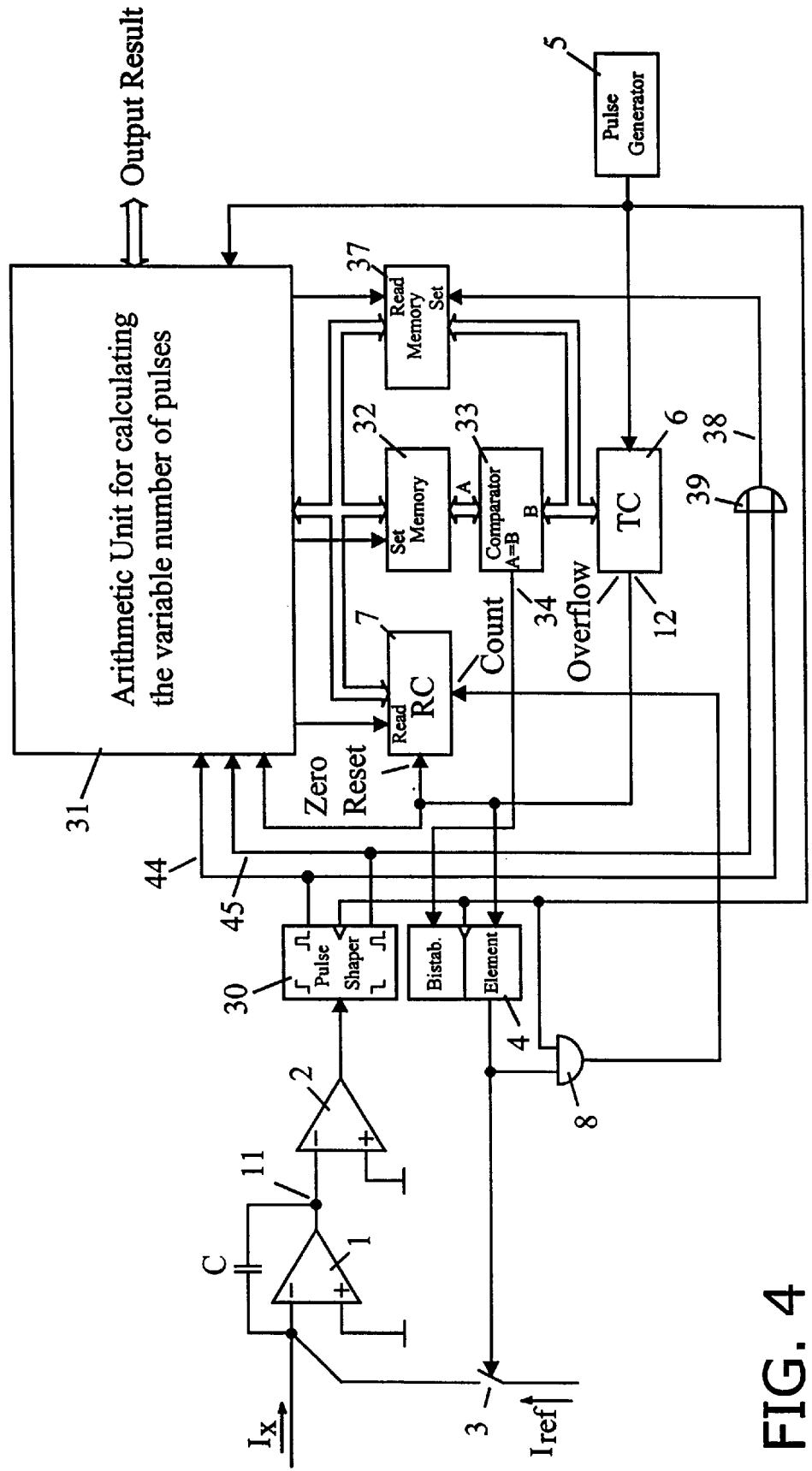
FIG. 4 shows a block circuit diagram of a first embodiment of the invention.

The circuit shown in FIG. 4 is similar in some respects to the circuit already described in FIG. 1. The integration amplifier 1, the comparator 2, the switch 3, the bistable element 4, the pulse generator 5, the time counter 6, which brings the bistable element into the "on" condition with its overflow output via the line 12, and the result counter 7, which counts the pulses of the pulse generator 5 via the gate 8 as long as the switch 3 is closed, are the same or analogous to the elements in the circuit diagram shown in FIG. 1. However, the signal line 13, via which the comparator 2 brings the bistable element 4 back into the "off" condition in the circuit of FIG. 1, is missing in the circuit according to FIG. 4. Instead, the switching flanks of the comparator 2 are converted into short pulses by a pulse shaper 30, and the pulse for the positive and the negative switching flanks of the comparator 2 are supplied separately to an arithmetic unit 31 (lines 44 and 45). Both pulses activate an interrupt instruction in the arithmetic unit 31. In addition, the lines 44 and 45 are connected with the inputs of an Or gate 39 and activate a set instruction in a memory 37. The memory 37 then is set to the value of the time counter 6. The arithmetic unit 31 then reads out the count of the memory 37 a few clock cycles later in response to the interrupt instruction. The arithmetic unit 31 therefore does not need an internal timer for determining the time of the interrupt instruction and thereby the time of the switching flanks of the comparator 2. The arithmetic unit 31 now calculates the time at which the bistable element should be switched back to the "off" condition and writes the pulse number of the time counter 6 corresponding to this time into a memory 32. A comparator 33 continuously compares the instantaneous count of the time counter 6 with the content of the memory 32 and, when they correspond, releases a signal at the output

34 that switches the bistable element into the "off" condition. If, for example, after 5347 pulses of the pulse generator 5 (count of the time counter is thus 5347), the comparator changes its sign, and the arithmetic unit calculates a delay time of 716 clock cycle pulses, the arithmetic unit sets the memory to 6063 in order to maintain the calculated delay time. This arithmetic unit is typically embodied by a microprocessor.

The method of operation of the circuit and the mathematical algorithms for determining the above-mentioned delay time will be described with reference to the timing diagram of FIG. 5. The curve trace in FIG. 5 corresponds to the curve trace in FIG. 2. The times $T_1$, in which the switch 3 is open and in which, therefore, only the current $I_x$ is integrated, and the times $T_2$, in which the switch 3 is closed and in which both currents are integrated, are shown in the same manner in both figures. The condition $T_2+T_1=T=$constant is also the same in both cases, due to the control of the overflow pulse of the time counter 6. Likewise, it is again assumed that $I_x<0$, $I_{ref}>0$ and $I_{ref}>|I_x|$.

Figure 2:
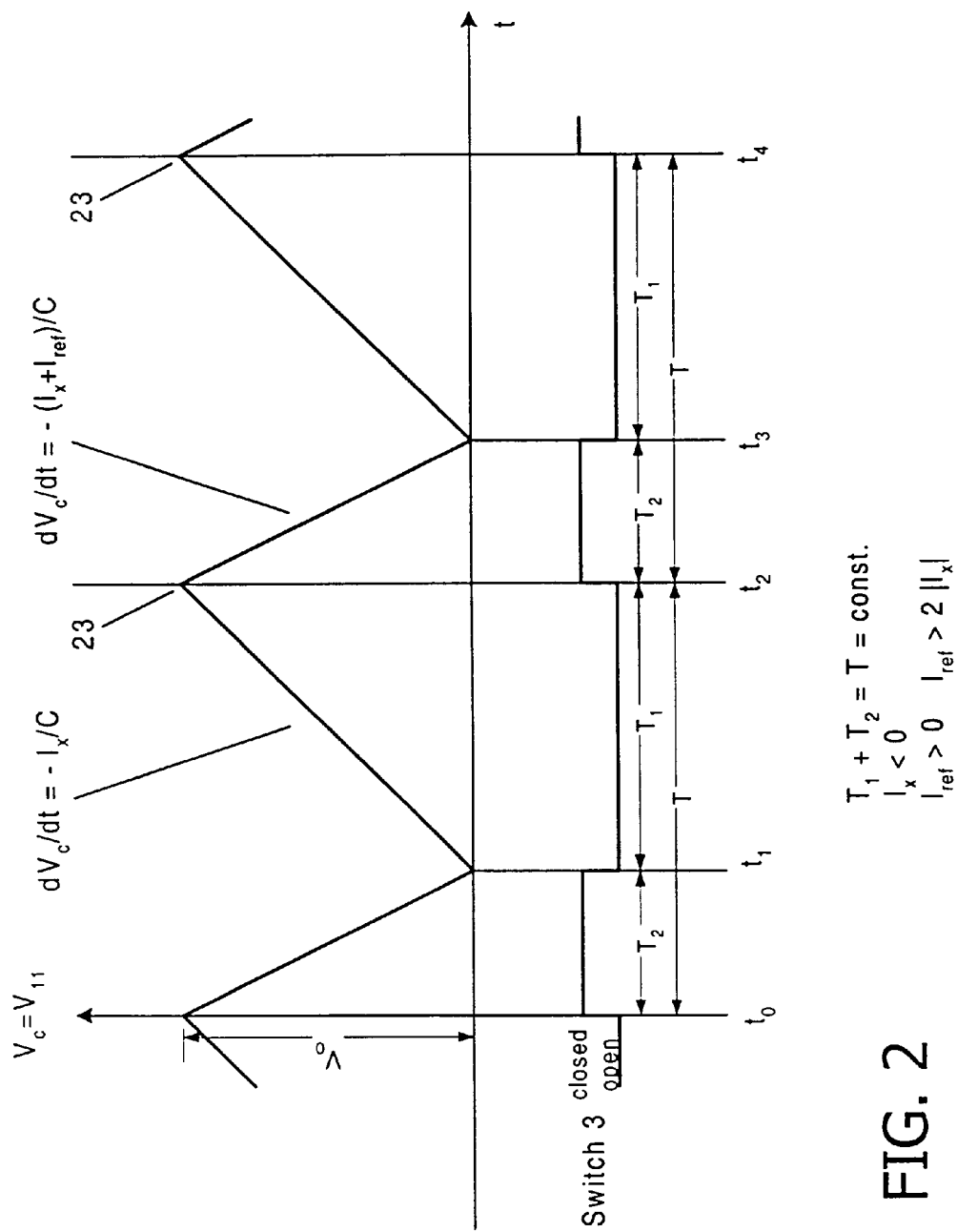
FIG. 2 shows a timing diagram for explaining the circuit diagram of FIG. 1.
Figure 3:
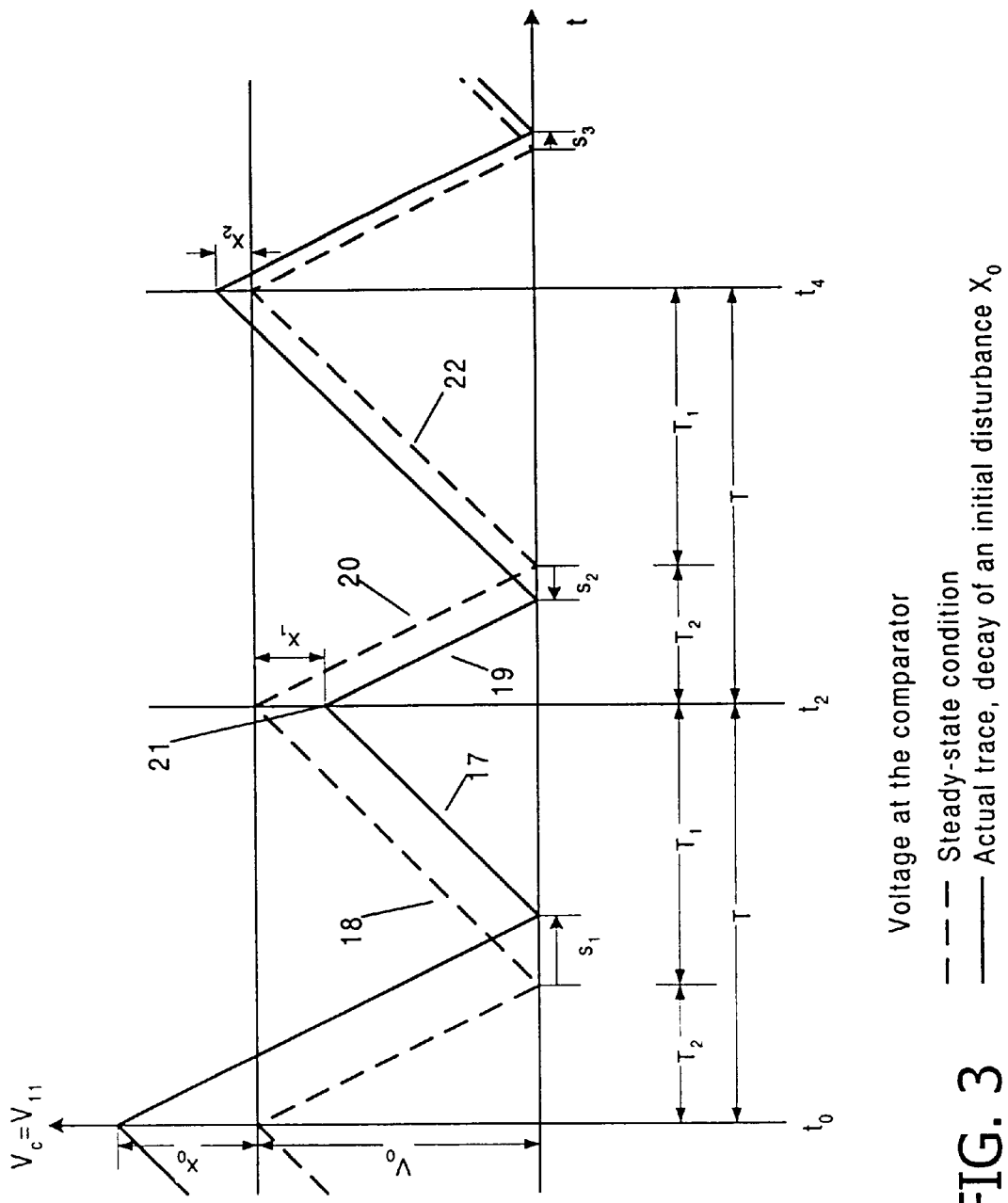
FIG. 3 shows the timing diagram of FIG. 2, with additional explanatory information added.
Figure 5:
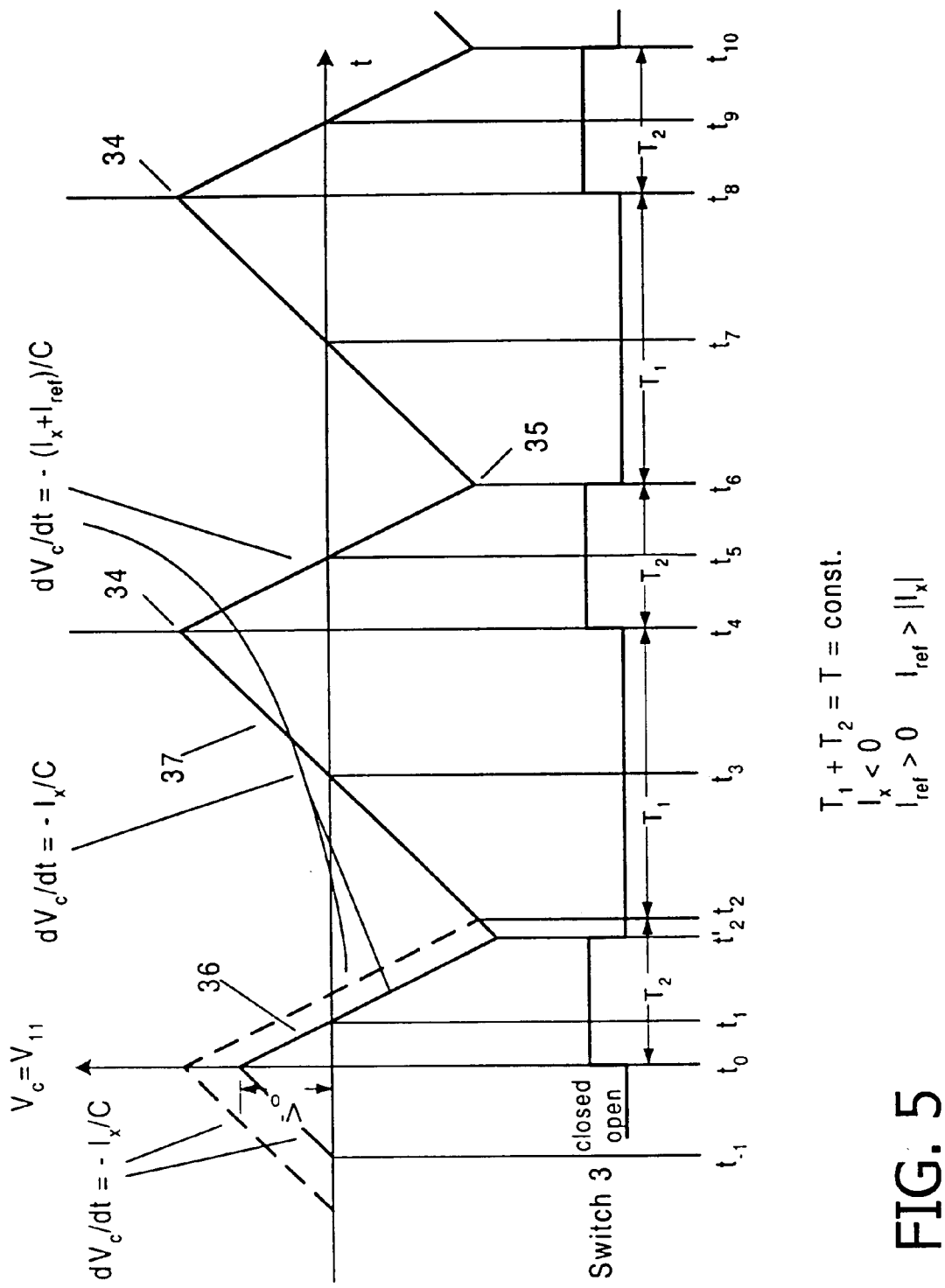
FIG. 5 shows a timing diagram for explaining the circuit diagram of FIG. 4.

The steady state condition is shown with a dashed line in FIG. 5, whereby the dashed line is no longer visible after the time $t_2$, as it coincides with the actual curve trace shown as a solid line. For this steady state condition, the displacement of the switching time of the bistable element serves only to produce a constant DC voltage component at the capacitor C. For this purpose, the positive flank of the comparator 2 in FIG. 4, which occurs during crossing through the comparator threshold at the times $t_5$, $t_9$ etc., is delayed in such a manner that $$t_6-t_5=t_5-t_4$$
$$t_{10}-t_9=t_9-t_8 \quad (8)$$

applies. Thus, the doubled value of the count of the time counter 6 is stored at each of the times $t_5$, $t_9$ etc. of the comparator threshold crossings in the memory 32. This ensures that the positive peak 34 of the voltage $V_C$ is exactly as large as the negative peak 35. If the comparator threshold is zero—as indicated in FIGS. 4 and 5—then the average value of the voltage at the capacitor C, i.e., the DC voltage component, is zero. In contrast to this, for the circuit according to the prior art, the switching points $t_1$, $t_3$ etc. in FIG. 2 are fixed at zero volts and the voltage peaks 23 change with the input signal $I_x$, so that the average value of the voltage at the capacitor C changes depending on the input signal.

The ability to displace the zero point of the integrator output signal is also advantageous for very quickly changing signals and when there are lower requirements for precision. Thus, changes of the measurement signal can be detected twice within one period, e.g., from time $t_1$ to time $t_5$ (see FIG. 5)—once between the times $t_1$ and $t_3$ and a second time between the times $t_3$ and $t_5$—such that the circuit can react immediately to these changes. In the process according to U.S. Pat. No. 5,262,780, this is only possible once within the same time period. This also doubles the maximum frequency, in the measurement value, that can be processed without aliasing. For the time periods indicated above, the value of the measurement signal is calculated as follows:

$$\frac{I_x}{I_{ref}} = -\frac{t_2'-t_1}{t_3-t_1}, \text{ and/or}$$

$$\frac{I_x}{I_{ref}} = -\frac{t_5-t_4}{t_5-t_3}$$

Due to the advantage that it is possible to perform modulations up to $$\frac{T_2}{T_1+T_2} < 1$$

the attainable resolution for this process in the same measurement time is twice as high as in the analog/digital converter according to the process of U.S. Pat. No. 5,262,780.

The process according to U.S. Pat. No. 5,262,780 and the processes described here offer the possibility of realizing a period time which is fixed or which is tailored to a disturbance. These processes thus have the advantage of suppressing disturbances, such as those which arise e.g. through supply voltage influences, by selecting the period time so that an optimal disturbance voltage suppression, independent of the measured value, is obtained. Accordingly, the resolutions can be significantly higher in these cases.

The processes according to the invention can react better and faster to disturbances by means of the features described above than can the process according to U.S. Pat. No. 5,262,780.

In the non-steady state condition, the delay time is used in order to reach the steady state curve trace as quickly as possible. In FIG. 5, the non-steady state actual curve trace is indicated with a solid line. It is hereby assumed that $I_x$ is constant for the entire time depicted but, however, that the actual curve deviates as indicated from the steady state curve due to, for example, a previously occurring disturbance or a previously occurring change of $I_x$. The slopes of the flanks of the actual curve and of the corresponding steady state curve are thus respectively equal.

In order to calculate the optimal switching time, an estimated value for $I_x/I_{ref}$ is calculated from the times $t_1$, $t_0$ and $t_1$. This is done on the basis of the equation:

$$-\frac{I_x}{C} \cdot (t_0 - t_{-1}) = V_0' = \frac{I_x + I_{ref}}{C} \cdot (t_1 - t_0) \quad (9)$$

After a few transformations, the following equation results from this equation:

$$\frac{I_x}{I_{ref}} = -\frac{t_1 - t_0}{t_1 - t_{-1}} \quad (10)$$

The times $t_{-1}$ and $t_1$ are known to the arithmetic unit 31 through the two comparator threshold crossing pulses from the pulse shaper 30, and the time $t_0$ is known from the overflow pulse 12 of the time counter 6.

The equation for the straight line 36, i.e., for the actual voltage trace, is apparent directly from FIG. 5:

$$V(t) = V_0' - \frac{I_x + I_{ref}}{C} \cdot (t - t_0) \quad (11)$$

which results in the following equation after transformation and use of equations (9) and (10):

$$V(t) = -\frac{I_{ref}}{C} \cdot (t_0 - t_{-1}) \cdot \left(\frac{t - t_1}{t_1 - t_{-1}}\right) \quad (12)$$

In addition, the steady state curve trace can be calculated from the value of $I_x/I_{ref}$ from equation (10) in the following manner. In the steady state condition, the following equation applies:

$$T_1 \cdot I_x + T_2 \cdot (I_x + I_{ref}) = 0 \quad (13)$$

And thereby:

$$\frac{T_2}{T_1 + T_2} = \frac{T_2}{T} = -\frac{I_x}{I_{ref}} \quad (14)$$

$$\frac{T_1}{T} = 1 - \frac{T_2}{T} = 1 + \frac{I_x}{I_{ref}} \quad (15)$$

As already shown above, the following equation applies in the steady state condition:

$$t_6 - t_5 = t_5 - t_4 = \frac{T_2}{2} \quad (16)$$

and therefore also:

$$t_8 - t_7 = t_7 - t_6 = t_4 - t_3 = \frac{T_1}{2} \quad (17)$$

From this, the zero-crossing at $t_3$ for the flank 37 of the steady state curve and also the slope thereof are known, so that the steady state line equation of the flank 37 can be calculated:

$$V(t) = \frac{I_x \cdot T}{2 \cdot C} \cdot \left(1 - \frac{I_x}{I_{ref}}\right) - \frac{I_x}{C} \cdot (t - t_0) \quad (18)$$

The point of intersection of the two straight lines 36 and 37 can therefore be determined from the equations (12) and (18) by equating. After a few transformations, one obtains:

$$\frac{t_2' - t_0}{T} = -\frac{I_x}{I_{ref}} \cdot \left(\frac{t_0 - t_{-1}}{T} + \frac{1}{2} - \frac{I_x}{2 \cdot I_{ref}}\right) \quad (19)$$

Therefore, if one selects the delay so that the bistable element 4 opens the switch 3 at time $t_2'$ in accordance with equation (19), the actual straight line 36 transitions directly into the desired steady state straight line 37 without any transient effect.

In equation (19), the estimated value for $I_x/I_{ref}$ is known from equation (10). Therefore, in order to calculate $t_2'$, the times $t_{-1}$, $t_0$, and $t_1$, and the constant time T are required, which are all known to the arithmetic unit.

This calculation procedure is repeated with each measurement cycle. Thus, in the next measurement cycle, the new switch-off point $t_6$ is calculated from the times $t_3$, $t_4$, and $t_5$ in the manner described and then stored in the memory 32. The actual trace is thereby constantly brought back to the desired trace and any tendency towards divergence is suppressed at its inception. In the same way, if the first determination of the desired trace is still inexact, the actual desired trace will be significantly more exactly achieved the second time.

In the preceding, the estimated value for $I_x/I_{ref}$ in accordance with equation (10) and FIG. 5 is calculated from the times $t_{-1}$, $t_0$, and $t_1$. The next estimated value is then calculated from the times $t_3$, $t_4$, and $t_5$ and used for the determination of the switching time $t_6$. This is the process that uses the most current data for the estimation each time. The calculation time for calculating the switching time $t_2'$, $t_6$ etc. is thereby nonetheless relatively brief. A longer calculation time is available if one calculates $I_x/I_{ref}$ and the switching time $t_6$ from the times $t_1$, $t_2'$, and $t_3$. The mathematical formulas necessary for this correspond to the equations (9) and (10).

Another possibility is to obtain the estimated value for $I_x/I_{ref}$ from the time from $t_1$ to $t_5$. For this possibility, the time $t_3$ is not needed, and therefore only zero-crossings of the same direction are evaluated, so that any possible hysteresis of the comparator 2 for positive and negative zero-crossings no longer plays a role. The formula necessary for the evaluation is:

$$\frac{I_x}{I_{ref}} = -\frac{(t_2' - t_1) + (t_5 - t_4)}{t_5 - t_1} \quad (20)$$

In order to obtain more calculation time in this embodiment, it is also possible to evaluate the period from $t_{-1}$ to $t_3$.

A further possibility is to use the measured value for $I_x/I_{ref}$ from the last measurement cycle as the estimated value for the subsequent measurement cycle. After all, the measured value for $I_x/I_{ref}$ is determined either from the measurement from $t_0$ to $t_4$ according to equation (3) or (14), or from the measurement from $t_1$ to $t_5$ according to equation (20), or from the measurement from $t_{-1}$ to $t_3$. The measurement result according to equation (3) or (14) is thereby directly available without further calculation steps as the count of the result counter 7, but is, however, exact only in the steady state condition. In contrast, the evaluation according to equation (20) requires division, and must therefore be performed in the arithmetic unit 31. However, this latter evaluation provides an exact result even in the non-steady-state condition.

If the digital arithmetic unit 31 calculates a switching time $t_2'$ that has already passed at the time the calculation is finished, then the arithmetic unit will cause the bistable element 4 to switch immediately and await the next measurement cycle for seeking to attain the desired trace.

In the steady state condition, it is possible to use either the respective counts at times $t_6$, $t_{10}$ for the period from $t_2$ to $t_6$ etc., or the counted pulses from $t_1$ to $t_2'$ plus the pulses from $t_4$ to $t_5$ for the period from $t_1$ to $t_5$ as the result of a measurement cycle, which, in turn, is used in the (running) summation for calculating the total result.

In the preceding, it is always assumed that the estimated value for $I_x/I_{ref}$ is derived from one single measurement operation. It is, however, also possible to obtain the estimated value for $I_x/I_{ref}$ from a weighted average of several measurement operations from the past. Details concerning weighted averaging and digital filtering in general are known to those skilled in the art, so they are not described in further detail here. In particular, it is known in the art to make the filter coefficients variable. This allows the digital filter to perform only a brief averaging when there are changes in the measured value, and average over a longer time when the measured value is approximately constant.

Many microprocessors already have analog/digital converters of moderate precision integrated therein. In this case, one can use the available analog/digital converter to provide the estimated value $I_x/I_{ref}$ for equation (19). The analog/digital converter according to the invention then provides a significantly more exact value.

Figure 6:
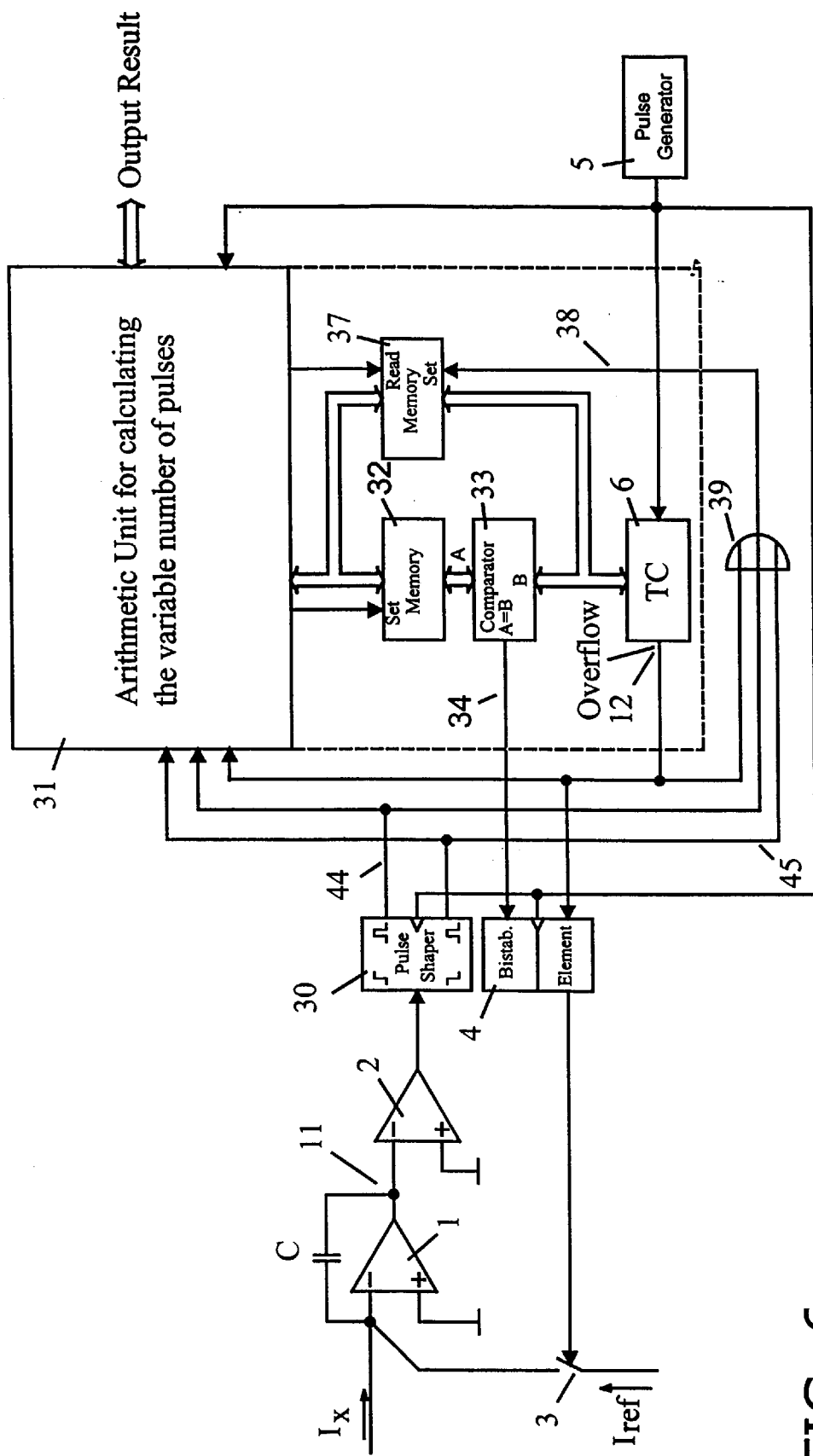
FIG. 6 shows a block circuit diagram of a second embodiment of the invention.

A second embodiment of the analog/digital converter is shown in FIG. 6 as a block diagram. The parts which are the same as in the block diagram of FIG. 4 are indicated with the same reference numbers and are not described again. No result counter is present in FIG. 6. The number which is held in the result counter in the circuit of FIG. 4 is, after all, equal to the number in the time counter 6 at times $t_2'$, $t_6$, $t_{10}$ etc. This number is, in turn, equal to the number which is in the memory 32 and leads to switching of the bistable element 4. The arithmetic unit 31 can therefore assume this number directly. The result counter 7 from FIG. 4 is therefore replaced in the embodiment of FIG. 6 by a virtual result counter in the arithmetic unit 31.

Naturally, further, alternative hardware realizations are possible for producing the temporal displacement of the switching times $t_2$, $t_6$, etc. For example, a settable counter can be provided which counts the pulses of the pulse generator 5 in parallel to the time counter 6. Once set by the arithmetic unit 31 to the pulse number corresponding to the desired time $t_2'$, this settable counter counts downward from this number, and produces the switching instruction for the bistable element 4 upon reaching zero. It is, of course, also possible to use a settable counter that counts upward and whose overflow signal produces the switching instruction for the bistable element 4. Further hardware realizations for achieving the temporal displacement will be readily apparent to those skilled in the art and are part of the scope of the present invention.

If the arithmetic unit 31 is provided by a microprocessor, some of the functions of the memories, counters, etc., which are indicated in the figures as discrete components, can be incorporated into the microprocessor. In FIG. 6, these parts of the circuit are bounded by a dashed border. In addition, the pulse generator 5 can be made, in part, a component of the microprocessor.

Figure 7:
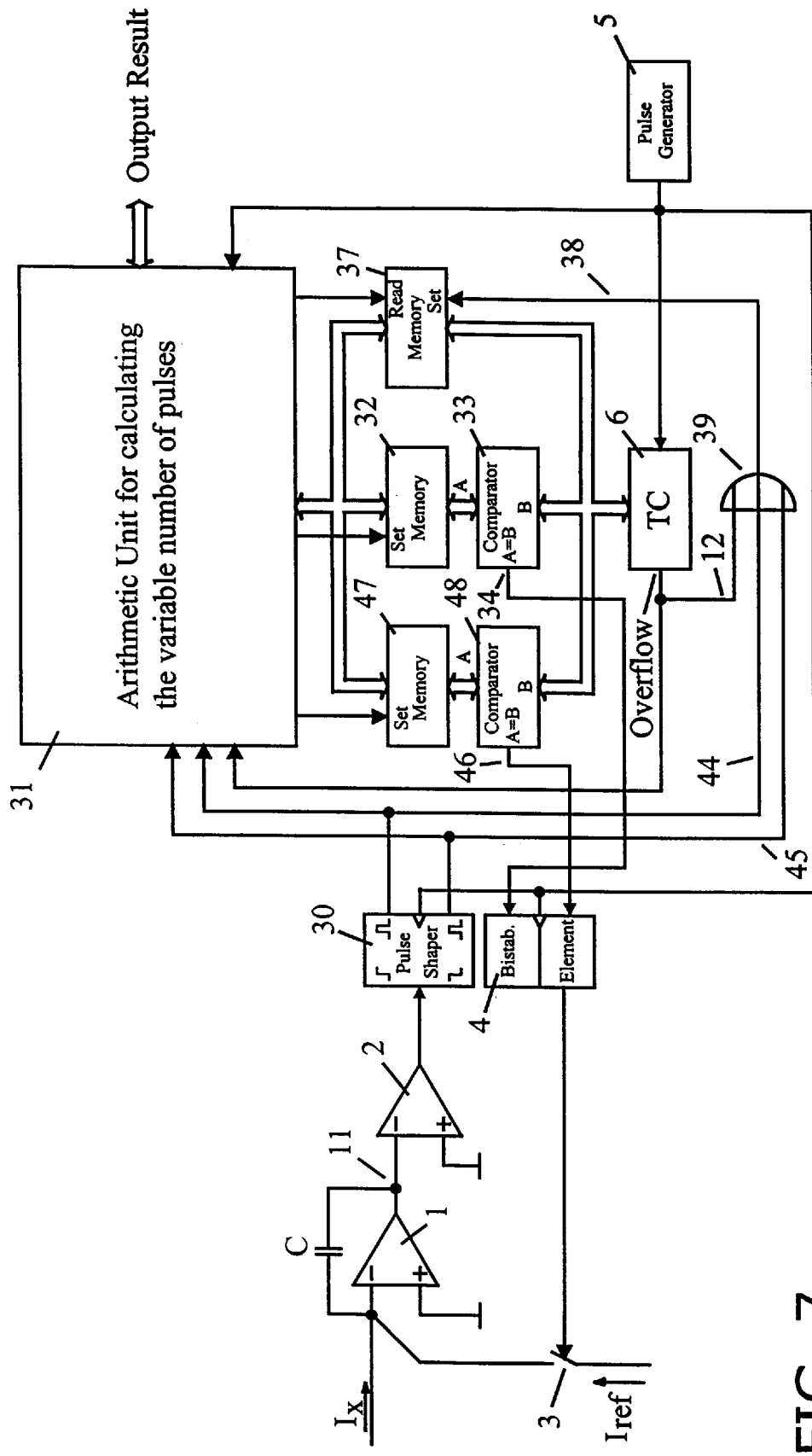
FIG. 7 shows a block circuit diagram of a third embodiment of the invention.
Figure 8A:
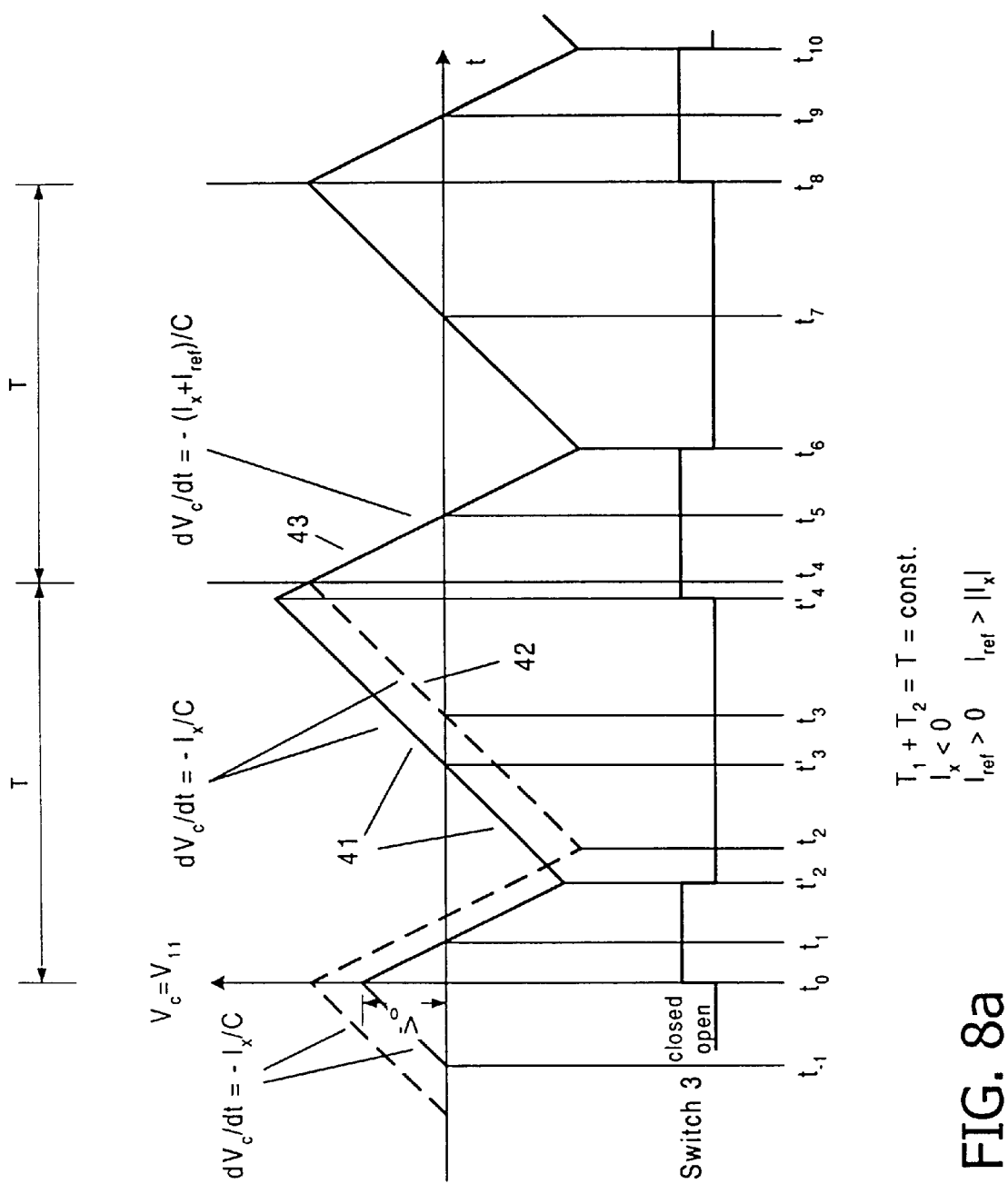
FIG. 8a shows a timing diagram for explaining the circuit diagram of FIG. 7.

A third embodiment of the analog/digital converter according to the invention is shown in FIG. 7. A time diagram of the voltage at point 11 (output voltage of the integrator 1) is shown in FIG. 8a for explanation of the method of operation. In this embodiment, not only is the switching of the bistable element 4 from the "on" condition to the "off" condition displaced, but the switching from the "off" condition to the "on" condition is displaced as well. In the time diagram of FIG. 8a, the voltage trace in the steady state condition is again shown as a dashed line, while the actual voltage trace is shown with a solid line. After the time $t_4$, the actual trace and the steady state trace coincide. In FIG. 8a, it is assumed that the switching time $t_2'$ was selected incorrectly. This can be the case, for example, if the time $t_2'$ is only calculated according to the simple formula $$t'_2 - t_1 = t_1 - t_0 \qquad (21)$$

which applies only for the steady state condition, or if the estimated value for $I_x/I_{ref}$ in equation (19) comes from older measurement results and/or is determined from several measurement results and therefore is no longer exactly correct following a change in value of the input signal. In FIG. 8a, the actual straight line 41 therefore deviates from the desired straight line 42 for the steady state condition even after the switching time $t_2'$.

An estimated value for $I_x/I_{ref}$ can be calculated for this case as well, according to the same formalism as was explained with the aid of FIG. 5 and the equations (8) to (19). The estimated value for $I_x/I_{ref}$ can be calculated, e.g., from the times $t_{-1}$, $t_0$, and $t_1$ or from the times $t_1$, $t_2'$, and $t_3'$—and the equation of the desired steady state straight line 43 can be calculated from this. The straight line 41 of the actual trace can also be calculated from the estimated value for $I_x/I_{ref}$ and the time $t_3'$. Subsequently, the intersection of the two straight lines 41 and 43 and thereby the optimal switching time $t_4'$ can then be calculated. Thus, if the bistable element 4 closes the switch 3 at time $t_4'$, the straight line 41 transitions directly into the desired steady state straight line 43 without an undesired transient effect.

In order to attain this capability of displacing the times $t_4$, $t_8$ etc., a second memory 47 is provided in the circuit according to FIG. 7, which is set by the arithmetic unit 31 to the state corresponding to the time $t_4'$. The (fixed) state of this memory 47 is compared with the (variable) state of the time counter 6 in a comparator 48 on a running basis and, if they are equal, the bistable element 4 is switched into the "on" condition via the line 46. The memory 47 hereby has the same number of digits as the time counter 6. A stored number just below the maximum count capacity thereby results in switching shortly before the time $t_4$ (in the case where $t_4'$ is before $t_4$, as shown in FIG. 8a); a stored number somewhat larger than zero results in switching shortly after the time $t_4$ (in the case where $t_4'$ is after $t_4$).

It is noted that the fixed time-slot pattern $t_0$, $t_4$, $t_8$ etc. remains constant in spite of the displacement. The time counter 6 continues to run and the bistable element 4 causes the switching of the switch 3 only somewhat before or somewhat after, respectively, the fixed times $t_0$, $t_4$, $t_8$ etc.

The circuit described in the preceding passage thus allows regulating intervention at the times $t_2$, $t_6$ etc., as well as at the times $t_4$, $t_8$, etc. A faster reaction to changes in the measured value is thus rendered possible.

Figure 8B:
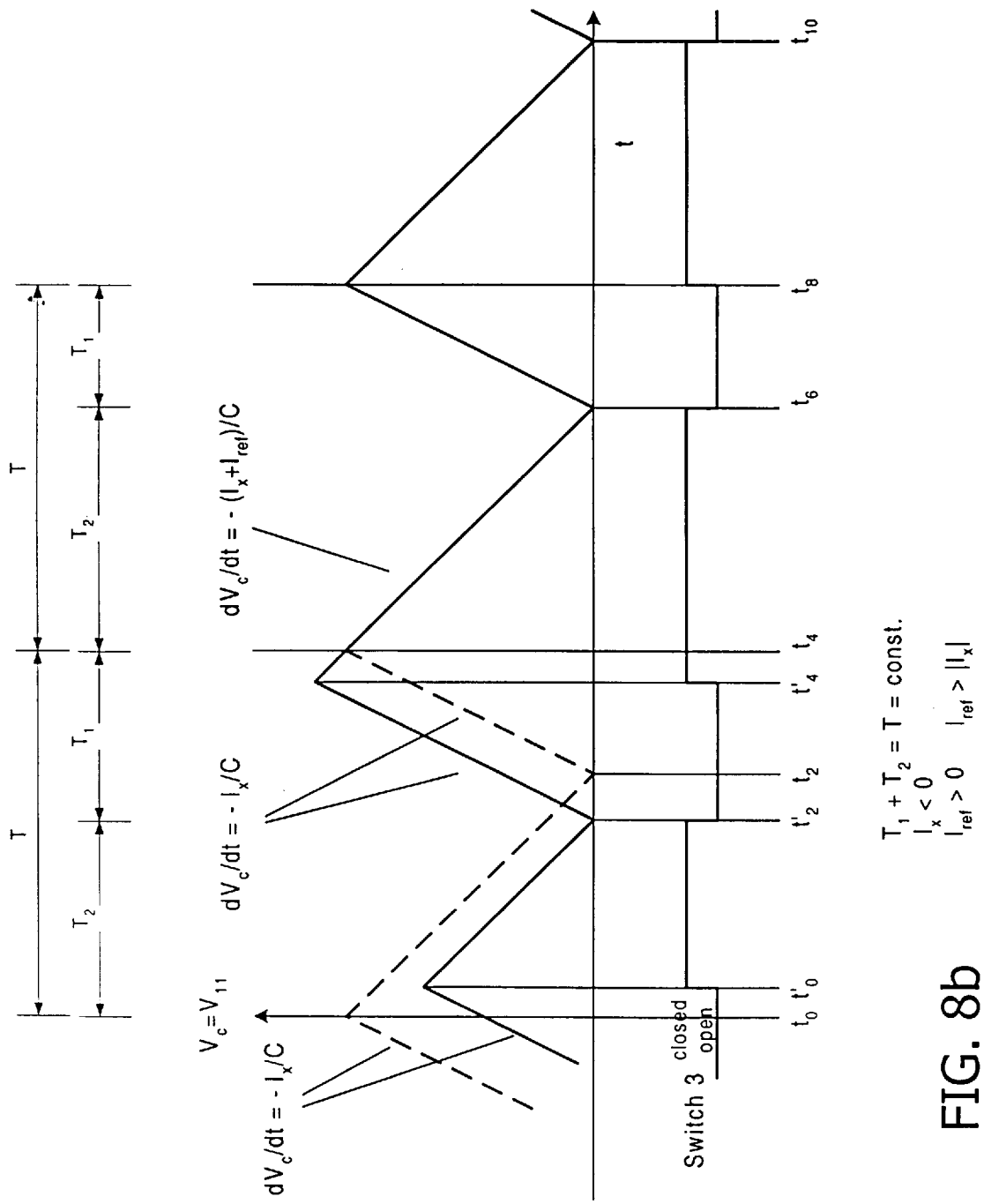

It is also possible to provide the displacement possibility only at the times $t_4$, $t_8$ etc., and to switch, in the manner of the prior art, at the times $t_1$, $t_5$ etc. in response to the first pulse after the comparator signal (time $t_2'$ then practically coincides with $t_1$). This variant is shown in FIG. 8b. It does not, however, offer the advantage of the constant DC voltage component at the integration capacitor C. In this variant, as the result of a measurement cycle, the current count at time $t_2'$, $t_6$, etc., corrected by the count pulses occurring during the changed switch-on times for the times $t_4'$, $t_8$, is relayed to the running summation for the overall result.

Figure 9:
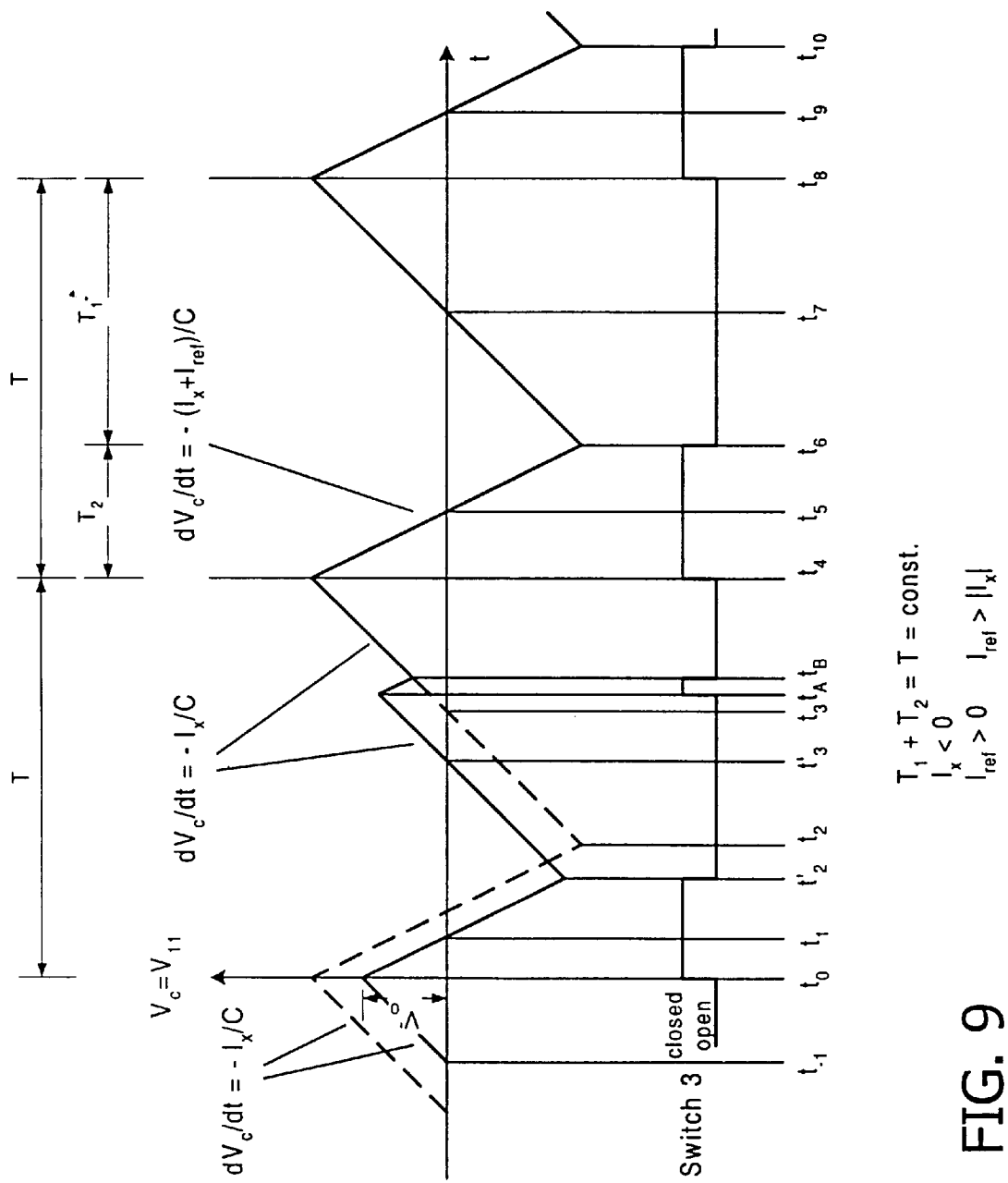
FIG. 9 shows a second timing diagram for the circuit shown in FIG. 7.

The circuit according to FIG. 7 not only allows corrective intervention by displacing the switching times; intervention can also be performed during (e.g., in the middle of) an up-integration or down-integration phase. An example of this is shown in FIG. 9. Until time $t_A$, the curve trace in FIG. 9 is identical with the curve trace in FIG. 8a. However, while in FIG. 8a the calculated intervention of the electronic equipment is postponed until switching time $t_4'$, in the example of FIG. 9, intervention is performed as soon as the calculation result is available. The switch 3 is closed at time $t_A$ and opened again a short time later at time $t_B$. The time difference $t_B - t_A$ in FIG. 9 is thereby equal to the time difference $t_4 - t_4'$ in FIG. 8a. Therefore, in the variant according to FIG. 9, the steady state curve trace is attained earlier—namely at time $t_B$—and a possibly excessive voltage at capacitor C is thereby prevented.

The cycle variant depicted in FIG. 9 is attained with the circuit according to FIG. 7 by storing the time $t_A$ in the memory 47 and the time $t_B$ in the memory 32. If the memory 47 is again set to zero after the time $t_B$, the regular switching time $t_4$ is thereby realized. It is, also possible to realize the fixed switching time $t_4$ through hardware by providing a direct connection from the overflow output of the time counter 6 to the bistable element 4, as is the case in the circuit according to FIG. 6.

A further circuit, which displaces the switching time $t_2$, $t_6$ etc., and $t_0$, $t_4$, $t_8$ etc., just like the circuit according to FIG.

Figure 10:
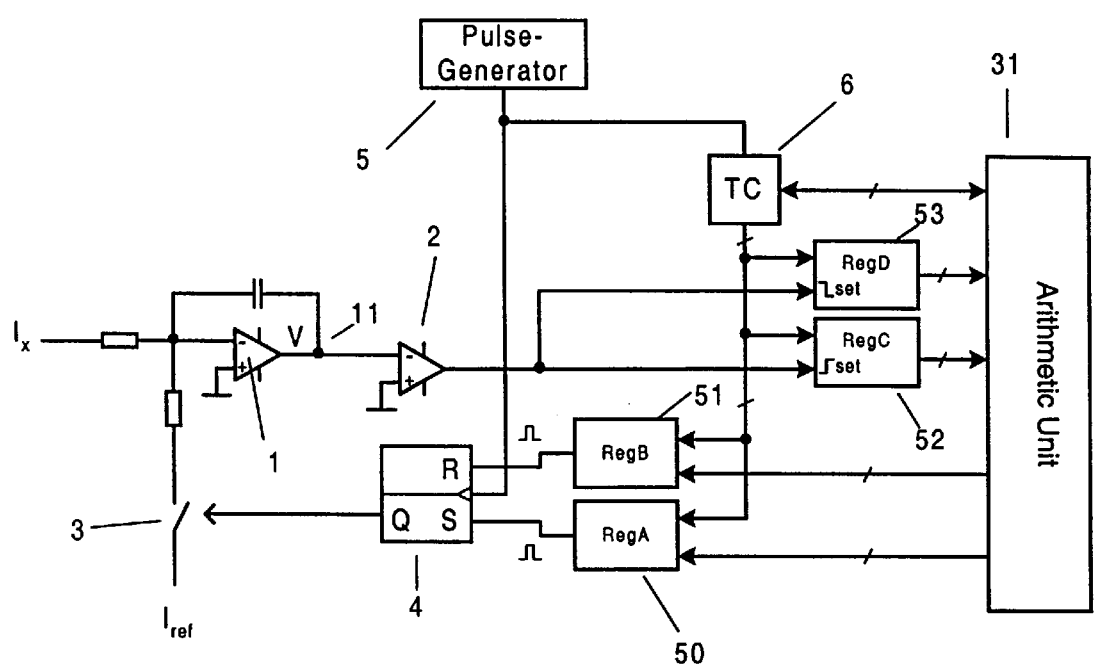
FIG. 10 shows a block circuit diagram of a fourth embodiment of the invention.

7, as well as introduces additional switching times $t_A$ and $t_B$, is shown in FIG. 10. This circuit is strongly oriented toward the hardware provided in many microprocessors and uses the available timer and register for realizing the cycle according to the invention. There are microprocessors which contain the essential digital hardware components from FIG. 10; as such, these components are shown as discrete elements only for purposes of explanation.

Figure 11:
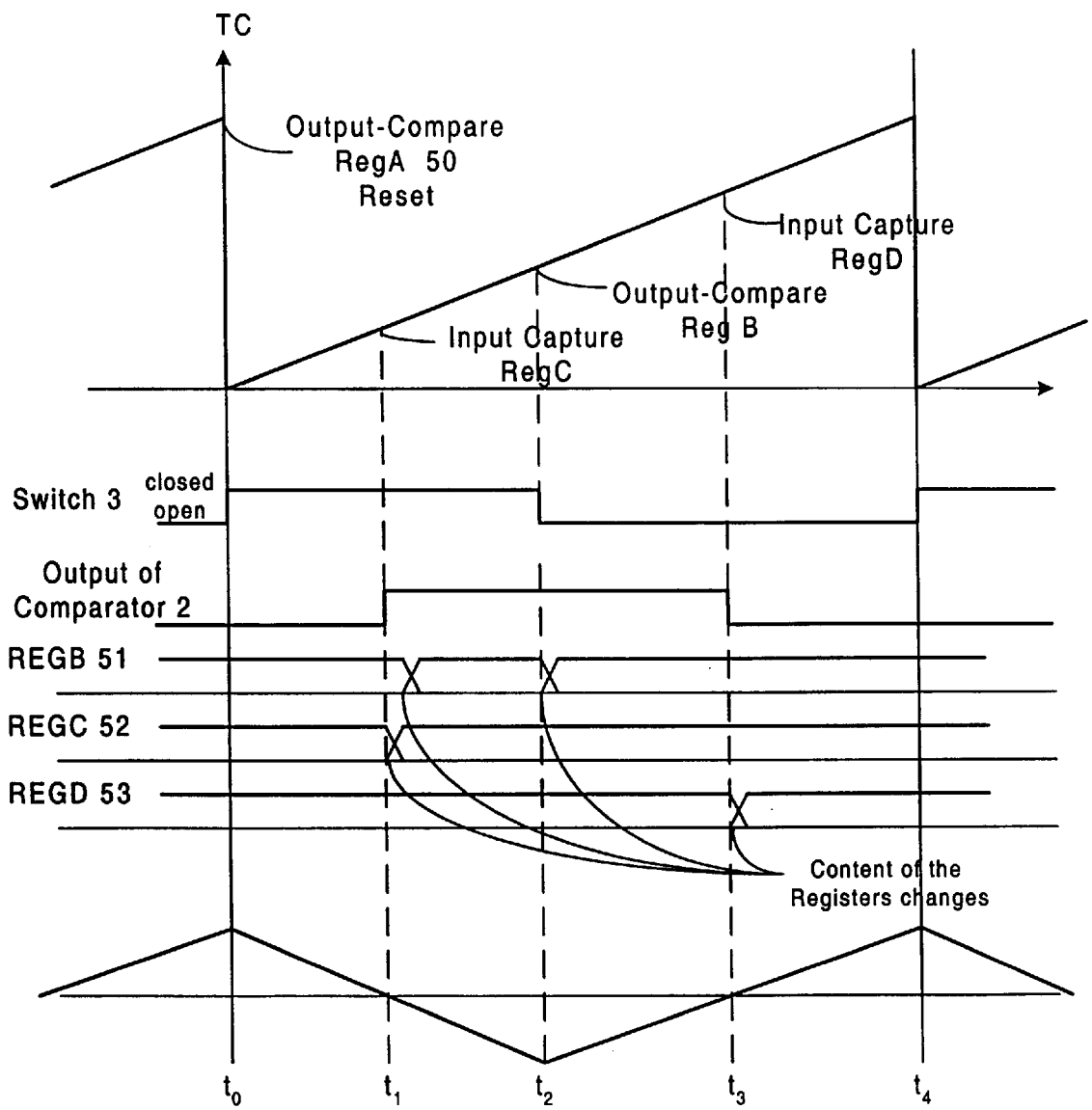
FIG. 11 shows a timing diagram for explaining the circuit diagram of FIG. 10.

An associated time diagram is shown in FIG. 11. The bistable element (RS flip-flop) 4 is driven by two logic circuits 50 and 51, which both contain a register with a comparator, and which are configured so that the processor can write to the registers. The count of the time counter 6 is continuously supplied to these circuits; if the count is equal to the register value, the circuits release a pulse (this is known as an output compare function). Two other registers 52 and 53 assume the count of the time counter 6 when a positive or negative flank of the comparator signal is detected (this is known as an input capture function). Both functions can, if necessary, prompt an interrupt of the processor and can also reset the time counter 6 if necessary. The maximum count (=>overflow) can be preset by the processor. The circuit paths necessary to implement this are not all shown in FIG. 10 for reasons of clarity; besides, they are not visible to the programmer in any case.

The setting of the bistable element 4 at the beginning of a measurement cycle (time $t_0$) is achieved by the fixed value zero in the register 50. Alternatively, the maximum count of the time counter 6 (=>period T) can also be set and linked with the reset of the counter. Register 51 is initially set to the maximum count of the time counter 6, so that no unintended reset of the bistable element 4 occurs. The count of the time counter 6 is captured in the register 52 in response to an increasing flank at the output of the comparator 2; in register 53 it is captured in response to a decreasing flank at the output of the comparator 2. All of these events trigger interrupts as necessary. After the interrupt at register 52 at time $t_1$, the switch-off time $t_2$ of the bistable element 4 is calculated and written as quickly as possible in register 51. Due to the calculation time, the calculated value must exceed the value from register 52 by a minimum amount. The exact convergence of the process cannot be attained until the next measurement cycle if insufficient calculation time is available. Register 51 is again first set to the maximum count after time $t_2$.

Figure 12:
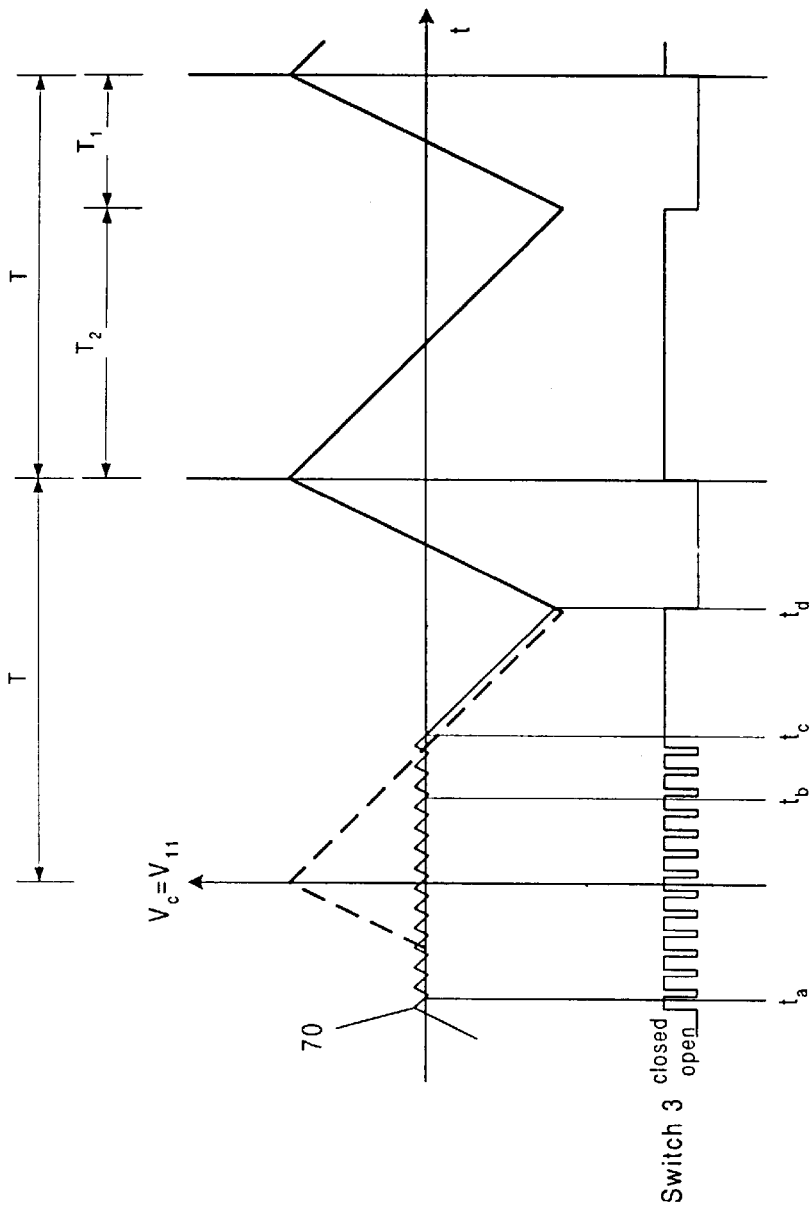
FIG. 12 shows a timing diagram for explaining the start of processing by the analog/digital converter, particularly for $0.5<|I_x/I_{ref}|<1$.

The beginning of the conversion process, particularly if $0.5 < |I_x/I_{ref}| < 1$, is described with reference to FIG. 12, by way of example: when the converter is switched on, the voltage at the output of the integrator can be, for example, <0. The processor now switches the bistable element 4 off until it is recognized with the help of the comparator level that the voltage at the output of the integrator is greater than zero. The bistable element is then switched on (time 70), whereby the voltage at the output of integrator is reduced. An observation time, in which the voltage at the output of the integrator is held at approximately zero, begins asynchronously to the time-slot pattern T with the zero crossing at time $t_a$. For this purpose, the bistable element is initially switched off again after $t_a$ until the voltage at the output of the integrator is >0, then switched on again, etc. After a sufficiently long observation time, a time is awaited in which a comparator threshold crossing has the same direction as was the case at time $t_a$, for example at time $t_b$. From the ratio of the sums of the switch-on times of the bistable element since $t_a$ to the total observation time $t_b - t_a$, an estimated value for $I_x/I_{ref}$ can then be determined which corresponds to the steady state trace of the voltage at the output of the integrator, indicated in FIG. 12 with a dashed line.

In order to synchronize the conversion process with the period T, the converter now awaits a zero-crossing of the voltage at the output of the integrator at a time $t_c$ immediately after the zero-crossing of the calculated steady state trace. After the time $t_c$, the switch-off time $t_d$ can be calculated, at which the trace of the voltage at the output of integrator transitions into the steady state trace. The start of the conversion process, as described, is based on the embodiment according to FIGS. 4 and 5, in which the steady state trace is attained by displacement of the switch-off time $t_d$ (in FIG. 12) or $t_2'$ (in FIG. 5), respectively. The conversion process can be started in a similar way if the embodiment according to FIG. 7 and FIGS. 8a/8b is used, in which the steady state trace is attained by displacement of the switch-on time $t_4'$ (in FIGS. 8a/8b).

In the preceding, it is always assumed that the clock frequency 1/T of the measurement cycles is constant. The circuit according to FIG. 10 and a few of the described variants of the circuit according to FIG. 7, however, also allow the tailoring of the clock frequency to external presets. This is, for example, advantageous if disturbances are superimposed on the input signal, which have a known frequency that changes, at most, slowly. For example, balances with a conveyor band driven by an asynchronous motor produce a superimposed disturbance having the frequency of the motor speed in the event of a mechanical imbalance of the motor; or, in DC voltage networks which are powered by a generator driven by an asynchronous motor, AC voltage components arise that are not synchronized with the network AC voltage and which inductively or capacitively induce interference voltages in measuring leads. These disturbances, which are not synchronized with the power supply frequency, are not very strongly suppressed by typical analog/digital converters. Rather, in typical analog/digital converters, the measurement period T is selected as a multiple of the power supply period and optimal suppression of the disturbances synchronized with the power supply is thereby achieved. The displacement abilities described for the switching times of the bistable element 4 can additionally be used in this special case for altering the time T for a measurement cycle. The times $t_4$, $t_8$, etc. are selected so that the measurement time T assumes the desired value; the times $t_2'$, $t_6$, etc. are selected so that the convergence of the analog/digital converter as well as the constant DC voltage component at the capacitor C are attained. The changes in $t_4$, $t_8$, etc. are hereby undertaken in such a way that they are not compensated for in the next measurement cycle. This is, for example, the case in the variant of the circuit from FIG. 7, in which a settable counter is used as the time counter 6. The arithmetic unit 31 calculates the correct value for T based on the signals of an encoder at the motor causing the disturbances.

In the preceding, it is further always assumed that the comparator threshold of the comparator 2 is set at zero volts. This is the typical value for symmetrical voltage supply of the analog circuit. If the analog circuit is supplied with only one supply voltage, it is, however, also possible to set the comparator threshold to another fixed value—e.g., half of the supply voltage. In addition, it is also possible to periodically vary the comparator threshold, e.g., with a sawtooth voltage whose period is equal to the duration of a measurement cycle.

Furthermore, in the examples up to this point, it has always been assumed that the measured value to be digitized is provided as current $I_x$ and has only a constant sign. It is, however, also possible to digitize voltages $V_x$ with the analog/digital converter disclosed, as well as to digitize currents and/or voltages with changing signs. Examples of various networks for wiring the input of the integrator 1 are shown in FIGS. 13a to 13e for this purpose.

Figure 13A:
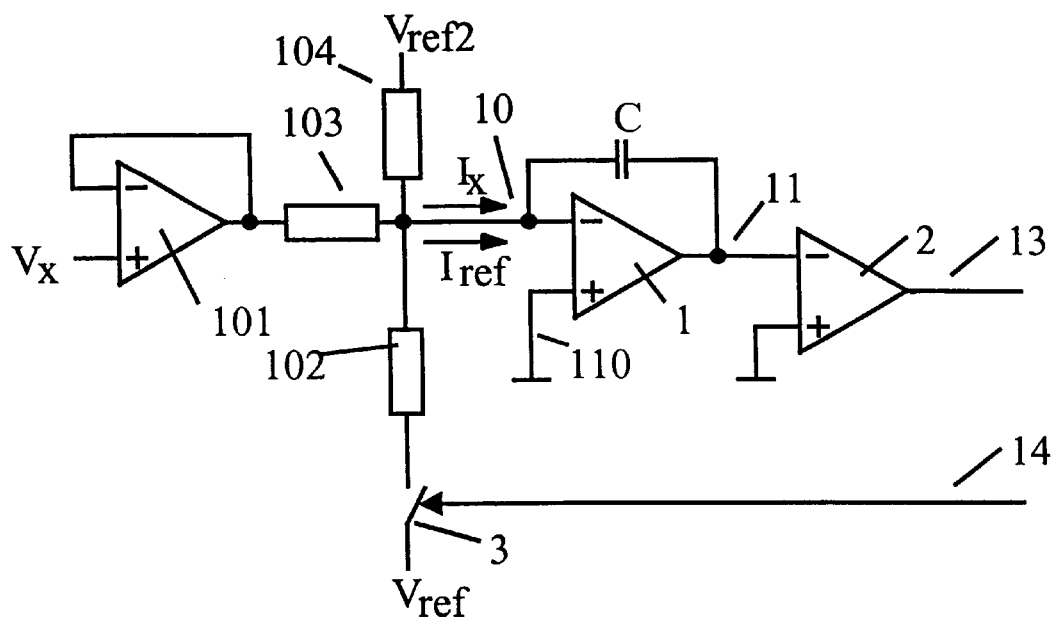
FIGS. 13a–e show several alternative wirings for the input of the integrator.

In FIG. 13a, the analog voltage $V_x$ to be converted is converted by a buffer amplifier 101 and a downstream resistor 103 into the current $I_x$. The reference current $I_{ref}$ is derived from the reference voltage $V_{ref}$ via the resistor 102 in the same way. The remaining circuit components—with the exception of resistor 104—correspond to the circuit components already described and have the same reference numbers. The resistor 104 additionally shows how the input measurement range of the analog/digital converter can be shifted: if the measurement range of the analog/digital converter without the resistor 104 is, e.g., 0 . . . 10 volts, then the measurement range can be shifted to, e.g., ±5 volts by means of an appropriate resistor 104 and an appropriate constant voltage $V_{ref\,2}$. This provides the ability to convert input voltages of either sign to be converted with one reference voltage of a single polarity.

Figure 13B:
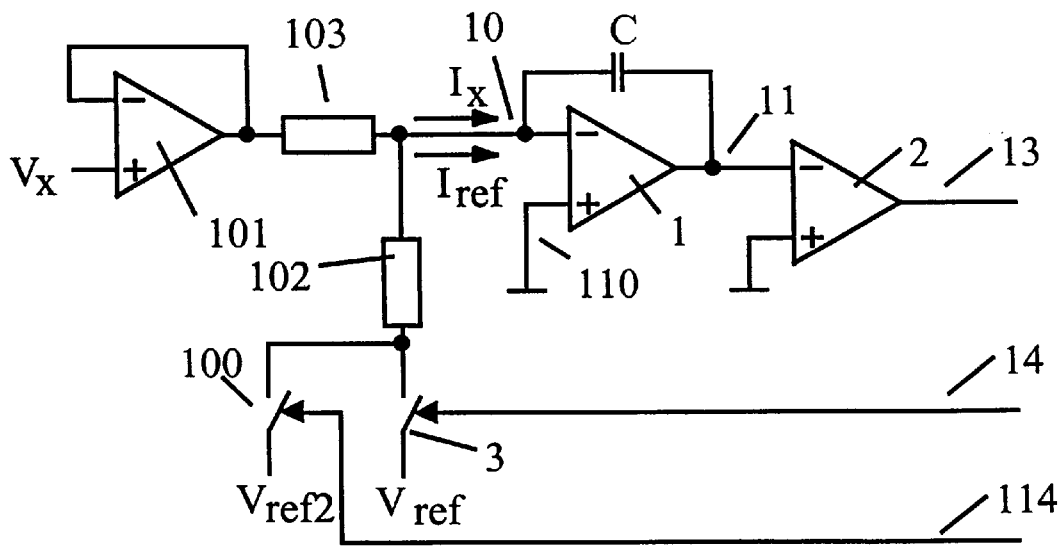

In contrast, FIG. 13b shows a variant in which one of two reference voltages $V_{ref}$ or $V_{ref\,2}$, with mutually different signs, is used, depending on the sign of the measured value $V_x$. The actuation of either the switch 3 via the line 14 or the switch 100 via the line 114 is controlled by a sign logic.

Figure 13C:
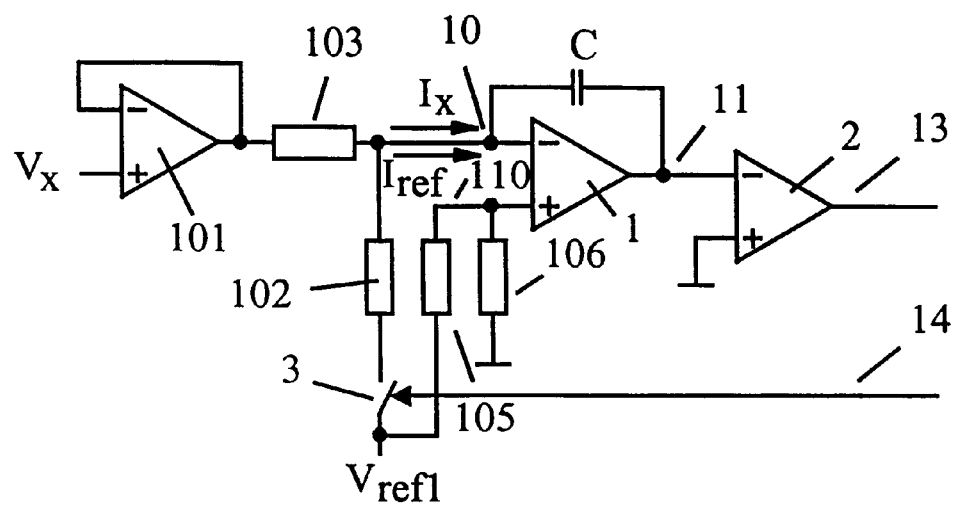

The circuit depicted in FIG. 13c is similar to the circuit from FIG. 13a, except here the shift of the measurement range is effected by means of a voltage divider that includes the resistors 105 and 106. The voltage divider sets the reference input 110 of the integrator 1 to a constant potential derived from the reference voltage $V_{ref}$.

Figure 13D:
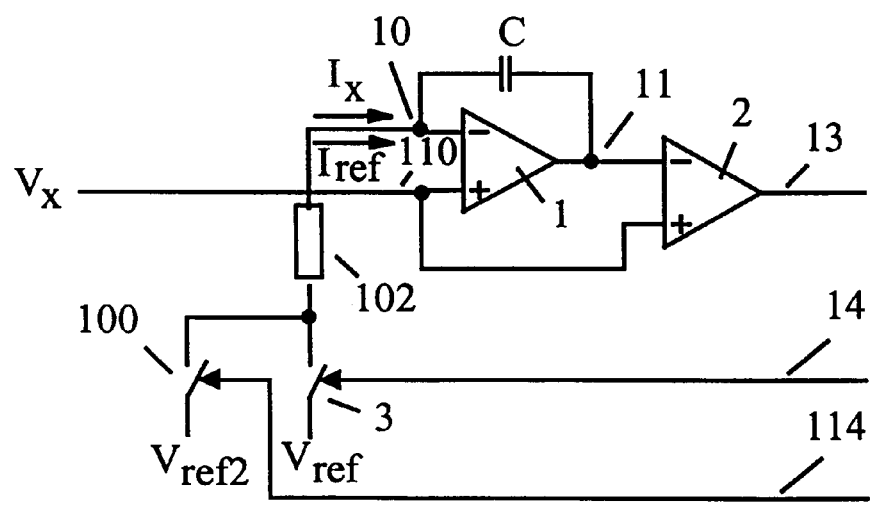

In the circuit of FIG. 13d, the voltage $V_x$ to be converted is connected directly to the reference input 110 of the integrator 1. The resistor 102 to the reference voltage $V_{ref}$ is, as usual, connected to the inverting input 10 of the integrator 1. The other end of the resistor 102 is connected to the first reference voltage $V_{ref}$ via the switch 3 and to the second reference voltage $V_{ref\,2}$ via the switch 100. The two switches 3 and 100 are driven by the two outputs of the bistable element 4 (not shown) via the lines 14 and 114 in such a way that one switch is always open and one switch is always closed. If $V_{ref\,2}=0$ is selected, the circuit functions exactly like the circuits described previously, as can be readily verified. If, on the other hand, $V_{ref\,2}=-V_{ref}$ is selected, then the measurement range for $V_x$ can again be expanded to include both signs.

Figure 13E:
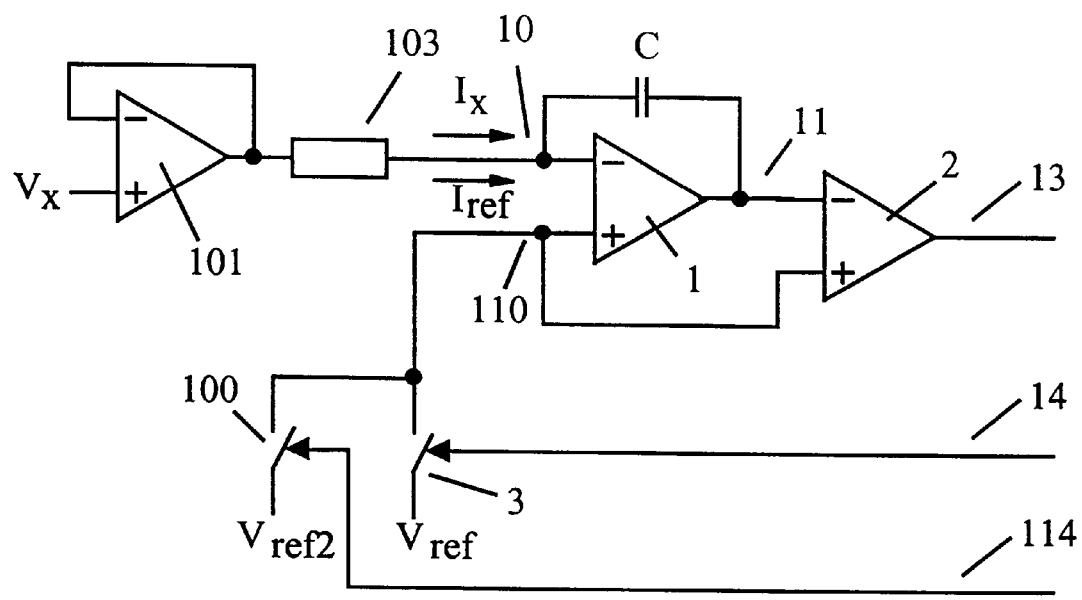

In the circuit according to FIG. 13e, the current $I_x$ derived from the measurement voltage $V_x$ is supplied as usual to the inverting input 10 of the integrator 1. The reference voltages $V_{ref}$ and $V_{ref\,2}$ are, however, alternately connected via the switch 3 or 100, respectively, with the reference input 110 of the integrator 1, and the reference current $I_{ref}$ is thereby indirectly produced. If $V_{ref\,2}=0$ is selected, then the circuit again operates as usual; if $V_{ref\,2}=-V_{ref}$ is selected, then the continuous measurement of positive and negative values of $V_x$ is again made possible.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. Analog/digital converter, comprising:

an amplifier wired as an integrator, a comparator provided downstream from the integrator, a time counter that counts the pulses of a pulse generator, a bistable element that drives an input network of the amplifier with at least one switch in such a way that, in a first of two positions, a current $I_x$ proportional to an analog measured value is integrated, and, in a second of the two positions, a constant reference current $I_{ref}$ having opposite polarity to the current $I_x$ is integrated in addition to the current $I_x$, whereby the switching of the bistable element from the first position to the second position is controlled by the time counter, and the switching from the second position to the first position is controlled by an output signal of the comparator, whereby the switching from the second position to the first position defines a switch-off time, and whereby the pulses of the pulse generator are summed to a result during the time period the bistable element is in the second position, and additional switching circuitry that also controls the switching of the bistable element from the second position to the first position, by displacing the switch-off time of the bistable element by a number of pulses of the pulse generator.

2. Analog/digital converter according to claim 1, wherein:

the additional switching circuitry comprises an arithmetic unit that determines the number of pulses of the pulse generator that displace the switch-off time, the time counter continually counts the pulses of the pulse generator, the first position is an off condition of the bistable element, the second position is an on condition of the bistable element, and the output signal of the comparator is synchronized with the pulses of the pulse generator.

3. Analog/digital converter according to claim 2, wherein:

the amplifier comprises an integration capacitor; and the arithmetic unit controls the displacement of the switch-off time of the bistable element in such a way that a DC voltage component at the integration capacitor C is independent from the analog measured value.

4. Analog/digital converter according to claim 3, wherein the DC voltage component at the integration capacitor C is zero.

5. Analog/digital converter according to claim 2, wherein:

the arithmetic unit estimates a steady state voltage trace at an output of the integrator in each measurement cycle and calculates and controls the switch-off time of the bistable element, in such a way that the converter is stabilized if the measured value changes, and for a constant measured value, the steady state voltage trace is attained even if the bistable element is in the on condition more than 50% of a total time period.

6. Analog/digital converter according to claim 5, wherein the arithmetic unit calculates the switch-off time $t_2'$ of the bistable element (4) according to the following formula:

$$\frac{t_2' - t_0}{T} = -\frac{I_x}{I_{ref}} \cdot \left( \frac{t_0 - t_{-1}}{T} + \frac{1}{2} - \frac{I_x}{2 \cdot I_{ref}} \right)$$

whereby $\dfrac{I_x}{I_{ref}} = -\dfrac{t_1 - t_0}{t_1 - t_{-1}}$, and whereby:

$t_2'$ is the switch-off time of the bistable element, $t_0$ is the most recent switch-on time of the bistable element, $t_{-1}$ is the time of the most recent positive comparator threshold crossing, $t_1$ is the time of the most recent negative comparator threshold crossing, and T is the temporal distance between sequential switch-on times of the bistable element.

7. Analog/digital converter according to claim 1, wherein an integrating input of the amplifier is supplied with the current $I_x$ directly without a switch and is supplied with the reference current $I_{ref}$ via the at least one switch.

8. Analog/digital converter according to claim 1, wherein a reference input of the amplifier is directly connected with the voltage $V_x$ to be measured and an integrating input of the amplifier is connected with a reference voltage $V_{ref}$ via a resistor and the at least one switch.

9. Analog/digital converter according to claim 1, wherein the voltage $V_x$ to be measured is connected via a resistor with an integrating input of the amplifier, and a reference input of the amplifier is intermittently connected with a reference voltage $V_{ref}$ via the at least one switch and with a second reference voltage $V_{ref\,2}$ via a further switch that is driven inversely to the at least one switch.

10. Analog/digital converter according to claim 9, wherein the second reference voltage $V_{ref2}$ is zero.

11. Analog/digital converter according to claim 1, wherein the input network of the amplifier shifts the zero point of the analog/digital converter with additional currents or voltages supplied to the input network.

12. Analog/digital converter according to claim 1, wherein the additional switching circuitry comprises a microprocessor having a timer with an output-compare/input-capture logic.

13. Analog/digital converter according to claim 2, wherein the arithmetic unit evaluates the times of two immediately sequential comparator threshold crossings for determining the number of pulses of the pulse generator by which the switch-off time of the bistable element is to be displaced.

14. Analog/digital converter according to claim 13, wherein the arithmetic unit forms a weighted average from several pairs of immediately sequential comparator threshold crossings and uses the weighted average for determining the number of pulses of the pulse generator by which the switch-off time of the bistable element is to be displaced.

15. Analog/digital converter according to claim 2, wherein the arithmetic unit evaluates the times of two sequential comparator threshold crossings in the same direction for determining the number of pulses of the pulse generator by which the switch-off time of the bistable element is to be displaced.

16. Analog/digital converter according to claim 15, wherein the arithmetic unit forms a weighted average from several pairs of sequential comparator threshold crossings in the same direction and uses the weighted average for determining the number of pulses of the pulse generator by which the switch-off time of the bistable element is to be displaced.

17. Analog/digital converter according to claim 2, wherein the arithmetic unit uses a result from a second, less precise analog/digital converter for determining the number of pulses of the pulse generator by which the switch-off time of the bistable element is to be displaced.

18. Analog/digital converter according to claim 2, wherein the arithmetic unit uses a result of a preceding measurement cycle for determining the number of pulses of the pulse generator by which the switch-off time of the bistable element is to be displaced.

19. Analog/digital converter, comprising:
an amplifier wired as an integrator,
a comparator provided downstream from the integrator,
a time counter that counts the pulses of a pulse generator,
a bistable element that drives an input network of the amplifier with at least one switch in such a way that, in a first of two positions, a current $I_x$ proportional to an analog measured value is integrated, and, in a second of the two positions, a constant reference current $I_{ref}$ having opposite polarity to the current $I_x$ is integrated in addition to the current $I_x$, whereby the switching of the bistable element from the first position to the second position is controlled by the time counter, and whereby the switching from the first position to the second position defines a switch-on time, and
additional switching circuitry that also controls the switching of the bistable element from the first position to the second position, by displacing the switch-on time of the bistable element in each measurement cycle with respect to a fixed time-slot pattern of measurement cycles by a number of pulses of the pulse generator.

20. Analog/digital converter according to claim 19, wherein:
the first position is an off condition of the bistable element, and the second position is an on condition of the bistable element,
the additional switching circuitry comprises an arithmetic unit that calculates the number of pulses of the pulse generator that displace the switch-on time,
the additional switching circuitry controls the switch-on time of the bistable element in such a way that the converter is stabilized if the current $I_x$ changes and, for a constant current $I_x$, the steady state voltage trace is attained even if the bistable element is in the on condition more than 50% of a total time period,
the switching from the second position to the first position is controlled by an output signal of the comparator, and
the pulses of the pulse generator are summed to a result during the time period the bistable element is the second position, and an overall result is obtained from the sum of the pulses counted in several of the measurement cycles.

21. Analog/digital converter according to claim 19, wherein the additional switching circuitry comprises a microprocessor having a timer with an output-compare/input-capture logic.

22. Analog/digital converter according to claim 20, wherein the arithmetic unit evaluates the times of two immediately sequential comparator threshold crossings for determining the number of pulses of the pulse generator by which the switch-on time of the bistable element is to be displaced.

23. Analog/digital converter according to claim 22, wherein the arithmetic unit forms a weighted average from several pairs of immediately sequential comparator threshold crossings and uses the weighted average for determining the number of pulses of the pulse generator by which the switch-on time of the bistable element is to be displaced.

24. Analog/digital converter according to claim 20, wherein the arithmetic unit evaluates the times of two sequential comparator threshold crossings in the same direction for determining the number of pulses of the pulse generator by which the switch-on time of the bistable element is to be displaced.

25. Analog/digital converter according to claim 24, wherein the arithmetic unit forms a weighted average from several pairs of sequential comparator threshold crossings in the same direction and uses the weighted average for determining the number of pulses of the pulse generator by which the switch-on time of the bistable element is to be displaced.

26. Analog/digital converter according to claim 20, wherein the arithmetic unit uses a result from a second, less precise analog/digital converter for determining the number of pulses of the pulse generator by which the switch-on time of the bistable element is to be displaced.

27. Analog/digital converter according to claim 20, wherein the arithmetic unit uses a result of a preceding measurement cycle for determining the number of pulses of the pulse generator by which the switch-on time of the bistable element is to be displaced.

28. Analog/digital converter according to claim 20, wherein count results of the measurement cycles, including the respective displacements of the switch-on times of the bistable element, are summed, to obtain a high-resolution total result.

29. Analog/digital converter according to claim 20, wherein count results of the measurement cycles, including the respective displacements of the switch-on times of the bistable element, are relayed to a running summation, to obtain a total result having a high resolution and a high sampling rate.

30. Analog/digital converter according to claim 20, wherein:

at the start of the conversion by the converter, the additional switching circuitry switches the bistable element on and off in accordance with the level of the comparator, in order to bring the integrator voltage, and thereby the signal of the comparator, to a zero-crossing, which switches the bistable element off, and thereafter to switch the bistable element on until the signal of the comparator is brought to another zero-crossing, which again switches the bistable element off, and so on for a given number of iterations, whereby the integrator voltage is maintained approximately at zero in order to obtain an estimated value for the result of the measurement cycle from the ratio of the on-time period of the bistable element to the total time period of this procedure of switching the bistable element on and off, and the arithmetic unit then selects a next switch-on time of the bistable element based on the estimated value and a last one of the switch-off times, whereby the integrator voltage immediately transitions into the steady state trace in synchronization with the fixed time-slot pattern of the measurement cycles.

31. Analog/digital converter, comprising:

an amplifier wired as an integrator, a comparator provided downstream from the integrator, a time counter that counts the pulses of a pulse generator, a bistable element that drives an input network of the amplifier with at least one switch in such a way that, in a first of two positions, a current $I_x$ proportional to an analog measured value is integrated, and, in a second of the two positions, a constant reference current $I_{ref}$ having opposite polarity to the current $I_x$ is integrated in addition to the current $I_x$, whereby the switching of the bistable element from the first position to the second position is controlled by the time counter, and whereby the switching from the first position to the second position defines a switch-on time, whereby the switching from the second position to the first position is controlled by an output signal of the comparator, and whereby the switching from the second position to the first position defines a switch-off time, and additional switching circuitry that also controls the switching of the bistable element from the second position to the first position as well as the switching of the bistable element from the first position to the second position, by displacing the switch-off time as well as the switch-on time of the bistable element, respectively, by a respective number of pulses of the pulse generator.

32. Analog/digital converter according to claim 31, wherein:

the first position is an off condition of the bistable element, and the second position is an on condition of the bistable element, the additional switching circuitry comprises an arithmetic unit that determines the number of pulses of the pulse generator that displace the switch-off time, the time counter continually counts the pulses of the pulse generator, and the output signal of the comparator is synchronized with the pulses of the pulse generator.

33. Analog/digital converter according to claim 32, wherein:

the arithmetic unit selects the switch-on times and the switch-off times of the bistable element in such a way that the converter is stabilized if the current $I_x$ changes, and for a constant current $I_x$, the steady state voltage trace is attained even if the bistable element is in the on condition more than 50% of a total time.

34. Analog/digital converter according to claim 31, wherein the additional switching circuitry controls the bistable element to additionally briefly switch on and off in order to rapidly attain the steady state voltage trace at the integrator.

35. Analog/digital converter according to claim 31, wherein the additional switching circuitry comprises a microprocessor having a timer with an output-compare/input-capture logic.

36. Analog/digital converter according to claim 32, wherein the arithmetic unit evaluates the times of two immediately sequential comparator threshold crossings for determining the number of pulses of the pulse generator by which the switch-on or switch-off times of the bistable element are to be displaced.

37. Analog/digital converter according to claim 36, wherein the arithmetic unit forms a weighted average from several pairs of immediately sequential comparator threshold crossings and uses the weighted average for determining the number of pulses of the pulse generator by which the switch-on or switch-off times of the bistable element are to be displaced.

38. Analog/digital converter according to claim 32, wherein the arithmetic unit evaluates the times of two sequential comparator threshold crossings in the same direction for determining the number of pulses of the pulse generator by which the switch-on or switch-off times of the bistable element are to be displaced.

39. Analog/digital converter according to claim 38, wherein the arithmetic unit forms a weighted average from several pairs of sequential comparator threshold crossings in the same direction and uses the weighted average for determining the number of pulses of the pulse generator by which the switch-on or switch-off times of the bistable element are to be displaced.

40. Analog/digital converter according to claim 32, wherein the arithmetic unit uses a result from a second, less precise analog/digital converter for determining the number of pulses of the pulse generator by which the switch-on or switch-off times of the bistable element are to be displaced.

41. Analog/digital converter according to claim 32, wherein the arithmetic unit uses a result of a preceding measurement cycle for determining the number of pulses of the pulse generator by which the switch-on or switch-off times of the bistable element are to be displaced.

42. Analog/digital converter according to claim 32, wherein count results of the measurement cycles, including the respective displacements of the switch-on and switch-off times of the bistable element, are respectively summed, to obtain a high-resolution total result.

43. Analog/digital converter according to claim 32, wherein count results of the measurement cycles, including the respective displacements of the switch-on and switch-off times of the bistable element, are respectively relayed to a running summation, to obtain a total result having a high resolution and a high sampling rate.

44. Analog/digital converter according to claim 32, wherein:

at the start of the conversion by the converter, the additional switching circuitry switches the bistable element on or off in accordance with the level of the comparator, in order to bring the integrator voltage, and thereby the signal of the comparator, to a zero-crossing, and thereafter switches the bistable element alternately on and off, in order to maintain the signal of the comparator approximately at zero, in order to obtain an estimated value for the result of the individual measurement from the ratio of the on-time period of the bistable element to the total time period of this procedure of switching the bistable element on and off, and the arithmetic unit then selects at least one of the switch-on times or switch-off times of the bistable element based on the estimated value, on a last one of the switch-on or switch-off times, and on the time of the last change of the comparator signal, whereby the integrator voltage immediately transitions into the steady state trace in synchronization with the fixed time-slot pattern of the measurement cycles.

45. Analog/digital converter according to claim 31, wherein the additional switching circuitry reduces the period of the measurement cycles for very fast changes of the analog measured value.

46. Analog/digital converter according to claim 45, wherein count results of the measurement cycles, including the respective displacements of the switch-on and switch-off times of the bistable element and the respective time periods of the measurement cycles, are respectively summed or relayed to a running summation.

* * * * *